(12) United States Patent
Asaoka et al.

(10) Patent No.: US 12,035,584 B2
(45) Date of Patent: Jul. 9, 2024

(54) DISPLAY DEVICE AND METHOD FOR MANUFACTURING DISPLAY DEVICE

(71) Applicant: SHARP KABUSHIKI KAISHA, Osaka (JP)

(72) Inventors: Yasushi Asaoka, Osaka (JP); Shigeru Aomori, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 610 days.

(21) Appl. No.: 17/273,115

(22) PCT Filed: Sep. 7, 2018

(86) PCT No.: PCT/JP2018/033308
§ 371 (c)(1),
(2) Date: Mar. 3, 2021

(87) PCT Pub. No.: WO2020/049742
PCT Pub. Date: Mar. 12, 2020

(65) Prior Publication Data
US 2021/0225995 A1 Jul. 22, 2021

(51) Int. Cl.
*H10K 59/131* (2023.01)
*H10K 50/115* (2023.01)
(Continued)

(52) U.S. Cl.
CPC ......... *H10K 59/131* (2023.02); *H10K 50/115* (2023.02); *H10K 50/813* (2023.02);
(Continued)

(58) Field of Classification Search
CPC .. H10K 59/131; H10K 50/115; H10K 50/813; H10K 50/822; H10K 59/123; H10K 59/124; H10K 59/352; H10K 59/353; H10K 71/00; H10K 2102/351; H10K 59/1201; H10K 50/11; H10K 59/122; H10K 59/32; G09F 9/30; H05B 33/10; H05B 33/12; H05B 33/14
See application file for complete search history.

(56) References Cited

U.S. PATENT DOCUMENTS 6,366,025 B1 4/2002 Yamada
9,153,791 B2 * 10/2015 Akamatsu ............ H10K 59/122
(Continued)

FOREIGN PATENT DOCUMENTS

JP 2007066862 A 3/2007
JP 2008300367 A 12/2008
(Continued)

*Primary Examiner* — Jonathan Han
(74) *Attorney, Agent, or Firm* — ScienBiziP, P.C.

(57) ABSTRACT

A device includes an organic insulating film having a contact hole in which an inclined face is formed, a pixel electrode formed along an inclined face of the contact hole and the organic insulating film, an intra-pixel wiring line coupling the pixel electrode to a TFT within the contact hole, a light-emitting layer formed on the organic insulating film to cover the pixel electrode, a light-emitting layer formed to overlap the light-emitting layer at least in the inclined face of the contact hole, and a common electrode formed on the light-emitting layer correspondingly to the pixel electrode.

18 Claims, 22 Drawing Sheets

(51) Int. Cl.
  *H10K 50/813* (2023.01)
  *H10K 50/822* (2023.01)
  *H10K 59/123* (2023.01)
  *H10K 59/124* (2023.01)
  *H10K 59/35* (2023.01)
  *H10K 71/00* (2023.01)
  *H10K 102/00* (2023.01)

(52) U.S. Cl.
  CPC ......... *H10K 50/822* (2023.02); *H10K 59/123* (2023.02); *H10K 59/124* (2023.02); *H10K 59/352* (2023.02); *H10K 59/353* (2023.02); *H10K 71/00* (2023.02); *H10K 2102/351* (2023.02)

(56) References Cited

U.S. PATENT DOCUMENTS

| | | | | |
|---|---|---|---|---|
| 2007/0046185 | A1* | 3/2007 | Kim | H10K 59/353 313/504 |
| 2010/0295898 | A1* | 11/2010 | Sakai | H05B 33/10 347/40 |
| 2011/0272677 | A1* | 11/2011 | Takeuchi | H10K 59/123 438/35 |
| 2012/0217518 | A1* | 8/2012 | Abe | H10K 50/813 438/34 |
| 2012/0295509 | A1 | 11/2012 | Sakai et al. | |
| 2013/0323998 | A1 | 12/2013 | Sakai et al. | |
| 2016/0187751 | A1* | 6/2016 | Okita | G02F 1/13624 257/72 |
| 2018/0108842 | A1* | 4/2018 | Li | H10K 71/233 |

FOREIGN PATENT DOCUMENTS

| | | |
|---|---|---|
| JP | 2010269227 A | 12/2010 |
| JP | 5519537 B2 | 6/2014 |
| JP | 2016122135 A | 7/2016 |
| JP | 2018091924 A | 6/2018 |
| WO | 2011/138817 A1 | 11/2011 |

* cited by examiner

DISPLAY DEVICE AND METHOD FOR MANUFACTURING DISPLAY DEVICE

TECHNICAL FIELD

The disclosure is related to a display device and a method for manufacturing a display device.

BACKGROUND ART

PTL 1 discloses a configuration of a display device in which a contact hole having an inclined face is formed in an organic insulating film, a pixel electrode is formed along the organic insulating film and the inclined face of the contact hole, a light-emitting layer is formed on the organic insulating film to cover the pixel electrode, and a common electrode is formed on the light-emitting layer correspondingly to the pixel electrode.

CITATION LIST

Patent Literature

PTL 1: JP 5519537 B

SUMMARY

Technical Problem

However, when the light-emitting layer is applied and formed, a solution applied to form the light-emitting layer flows through the inclined face toward the bottom of the contact hole due to an influence of gravity, and thus, a film thickness of the light-emitting layer near the top of the inclined face of the contact hole is reduced. If the film thickness around the top of the light-emitting layer is thin, a distance between the pixel electrode and the common electrode is shortened, and when a current flows, an electric field concentrates near the top of the inclined face of the contact hole and an overcurrent flows, causing light emission unevenness in the display device.

Solution to Problem

A display device according to an aspect of the disclosure includes an organic insulating film formed to cover a first TFT and including a first contact hole, the first contact hole being provided with a first inclined face, a first pixel electrode formed along the first inclined face of the first contact hole and the organic insulating film, a first intrapixel wiring line electrically coupling to the first pixel electrode to the first TFT within the first contact hole, a first light-emitting layer formed on the organic insulating film to cover the first pixel electrode, a second light-emitting layer formed to overlap the first light-emitting layer at least in the first inclined face of the first contact hole, and a common electrode formed on the first light-emitting layer correspondingly to the first pixel electrode.

A method for manufacturing a display device according to an aspect of the disclosure is a method for manufacturing a display device, the display device including an organic insulating film formed to cover a first TFT and including a first contact hole, the first contact hole being provided with a first inclined face, a first pixel electrode formed along the first inclined face of the first contact hole and the organic insulating film, a first light-emitting layer formed on the organic insulating film to cover the first pixel electrode, a second light-emitting layer formed to overlap the first light-emitting layer at least in the first inclined face of the first contact hole, and a common electrode formed on the first light-emitting layer correspondingly to the first pixel electrode, and the organic insulating film being formed to cover a second TFT and including a second contact hole, the second contact hole being provided with a second inclined face, and the display device further including a second pixel electrode formed along the second inclined face of the second contact hole and the organic insulating film, the method including the steps of forming the first light-emitting layer on the first pixel electrode and within the second contact hole using a quantum dot photoresist, and forming the second light-emitting layer on the second pixel electrode and within the first contact hole using a quantum dot photoresist.

Advantageous Effects of Disclosure

According to an aspect of the disclosure, when a current flows, the electric field concentration near the top of the inclined face of the contact hole is mitigated, and the light emission unevenness in the display device caused by the overcurrent flowing can be reduced.

DESCRIPTION OF EMBODIMENTS

Hereinafter, "the same layer" means that the layer is formed in the same process (film formation process), "a lower layer" means that the layer is formed in an earlier process than the process in which the layer to compare is formed, and "an upper layer" means that the layer is formed in a later process than the process in which the layer to compare is formed.

Figure 1:
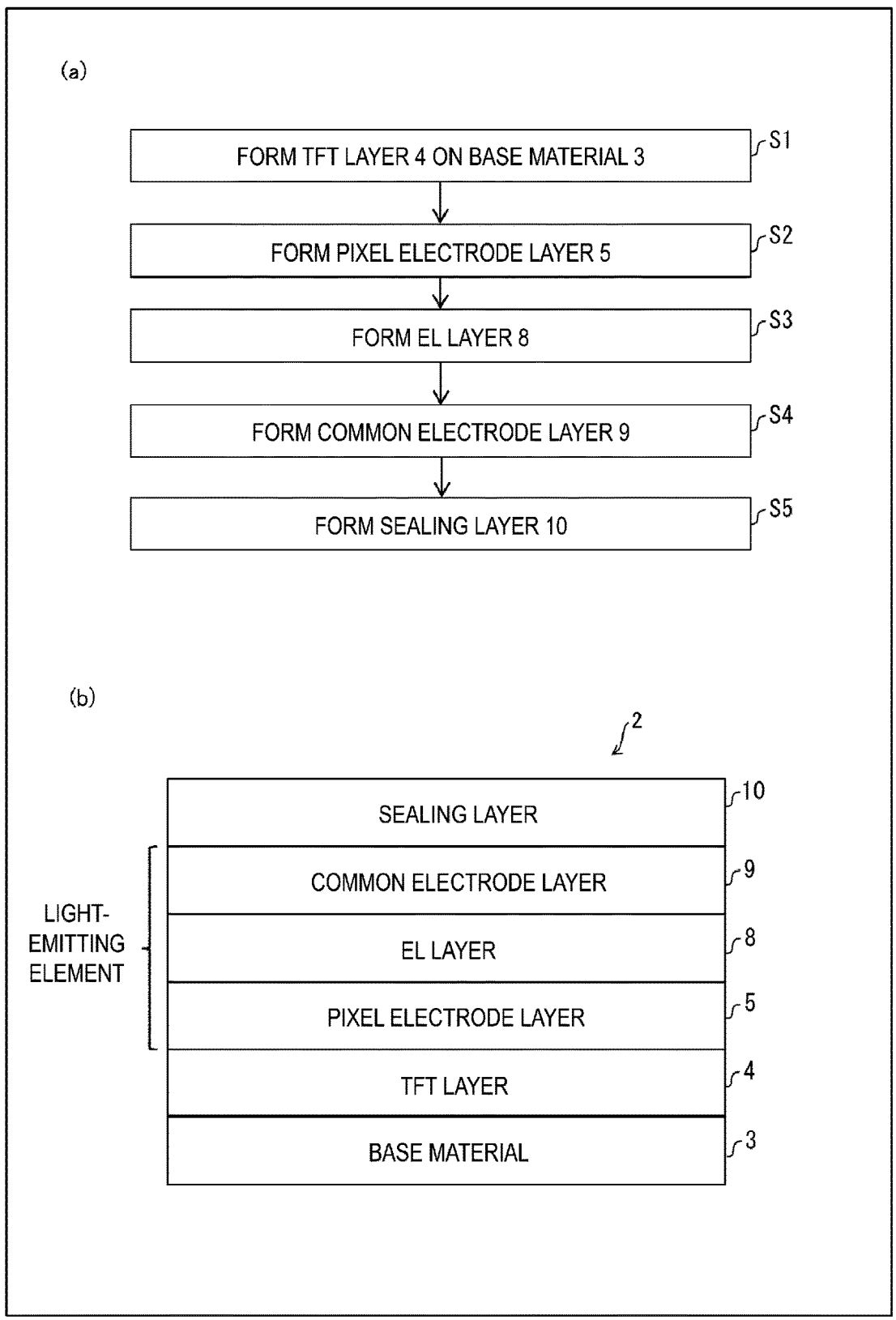
FIG. 1(a) is a flowchart illustrating an example of a method for manufacturing a display device.
FIG. 1(b) is a schematic view illustrating a cross-section configuration of the display device.

FIG. 1(a) is a flowchart illustrating an example of a method for manufacturing a display device 2, and FIG. 1(b) is a schematic view illustrating a cross-section configuration of the display device 2. As illustrated in FIG. 1, in manufacturing the display device 2, first, a thin film transistor (TFT) layer 4 is formed on a base material 3 (step S1). Next, a pixel electrode layer 5 is formed (step S2). Next, an electroluminescence (EL) layer 8 is formed (step S3). The EL layer 8 may be formed by a photolithographic method, or by a vapor deposition using a fine metal mask (FMM), for example. Next, a common electrode layer 9 is formed (step S4). Next, a sealing layer 10 is formed (step S5). Steps S1 to S4 are performed by a display device manufacturing apparatus (including a film formation apparatus that performs step S3).

Glass or a resin such as polyimide can be used for the base material 3. A barrier film made of silicon nitride or the like may be formed by film formation on the glass or resin to form the base material 3.

The TFT layer 4 is provided with a semiconductor layer, a plurality of metal layers, and a plurality of insulating layers, and a plurality of TFTs (thin film transistors) are formed. A control circuit for a light-emitting element (for example, a light emitting diode) including the pixel electrode layer 5, the EL layer 8, and the common electrode layer 9 is formed in the TFT layer 4.

The pixel electrode layer 5 includes a plurality of pixel electrodes having light reflectivity, the EL layer 8 includes a plurality of light-emitting layers (e.g., quantum dot layers, organic light-emitting layers), and the common electrode layer 9 includes a common electrode having optical transparency.

The pixel electrode layer 5 is formed by layering Indium Tin Oxide (ITO) and silver (Ag) or an alloy containing Ag, for example. The common electrode layer 9 is formed of an Mg—Ag alloy (ultra-thin film), ITO, and indium zinc oxide (IZO), for example. A work function differs between the pixel electrode layer 5 and the common electrode layer 9. The pixel electrode layer 5 may be on an anode side (high-voltage side) and the common electrode layer 9 may be on cathode side (low-voltage side), or the pixel electrode layer 5 may be on the cathode side (low-voltage side) and the common electrode layer 9 may be on the anode side (high-voltage side).

In a display region of the display device 2, a plurality of light-emitting elements including the pixel electrode layer 5, the EL layer 8, and the common electrode layer 9 are provided, and a driver that drives the TFT layer 4 and the like is provided to an outside of the display region (frame region).

In a case where the light-emitting element is a quantum dot light emitting diode (QLED), positive holes and electrons recombine inside the light-emitting layer in response to a drive current between the pixel electrode and the common electrode, and when excitons generated due to this recombination transition from a conduction band to a valence band of the quantum dots, light (fluorescence) is emitted. Since the common electrode is transparent and the pixel electrode is light-reflective, the light emitted from the EL layer 8 travels upwards and results in top-emitting.

In a case where the light-emitting element is an organic light-emitting diode (OLED), positive holes and electrons recombine inside the light-emitting layer in response to a drive current between the pixel electrode and the common electrode, and when excitons generated due to this recombination transition to a ground state, light is emitted. The light-emitting element is not limited to QLED or OLED, and may be an inorganic light emitting diode or the like.

The transparent sealing layer 10 includes an inorganic insulating film made of silicon nitride or the like, and inhibits foreign matters such as water and oxygen from infiltrating to the light-emitting element.

Example 1

Figure 2:
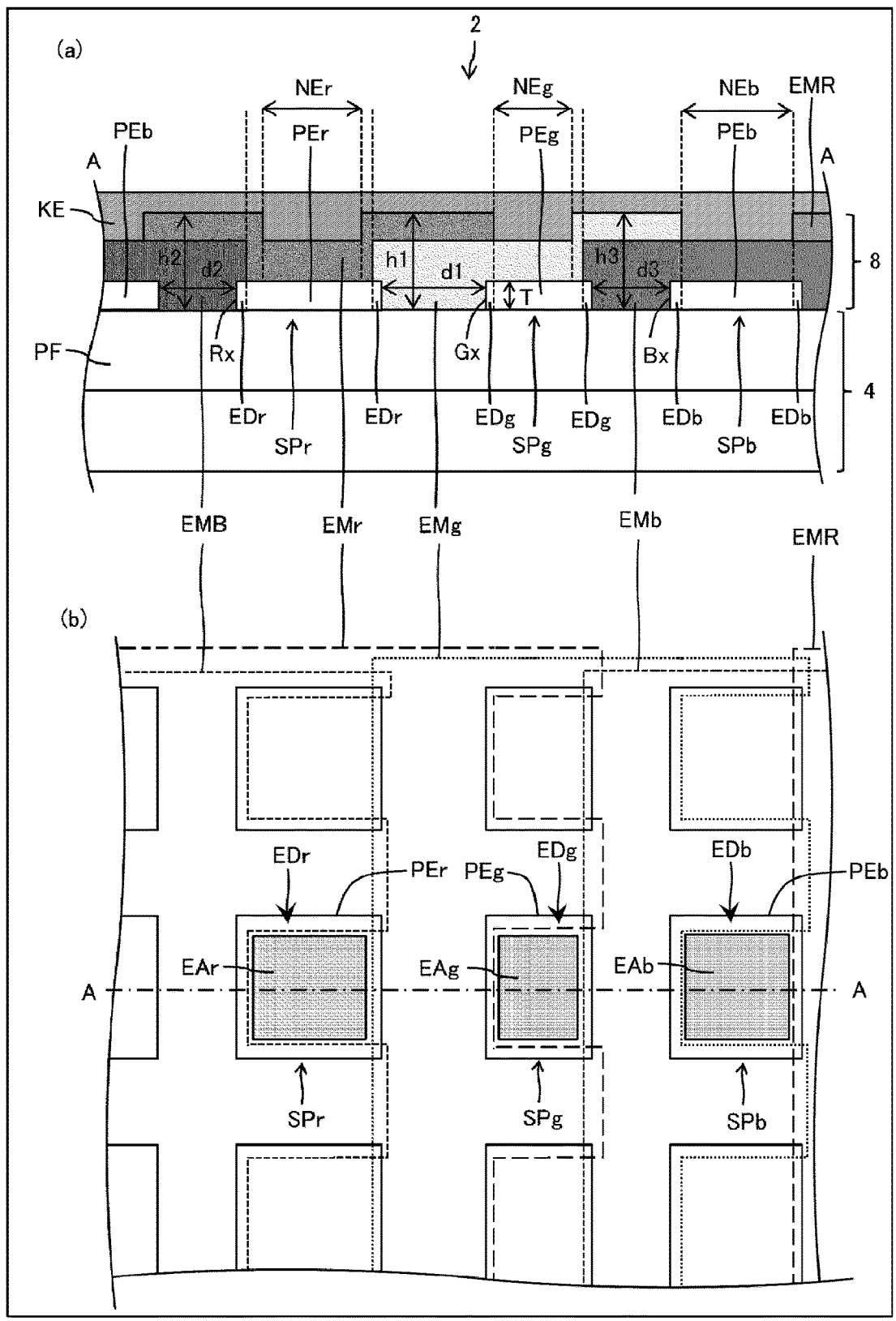
FIG. 2 is a correspondence diagram of cross-sectional and plan views of a display device according to Example 1.
Figure 3:
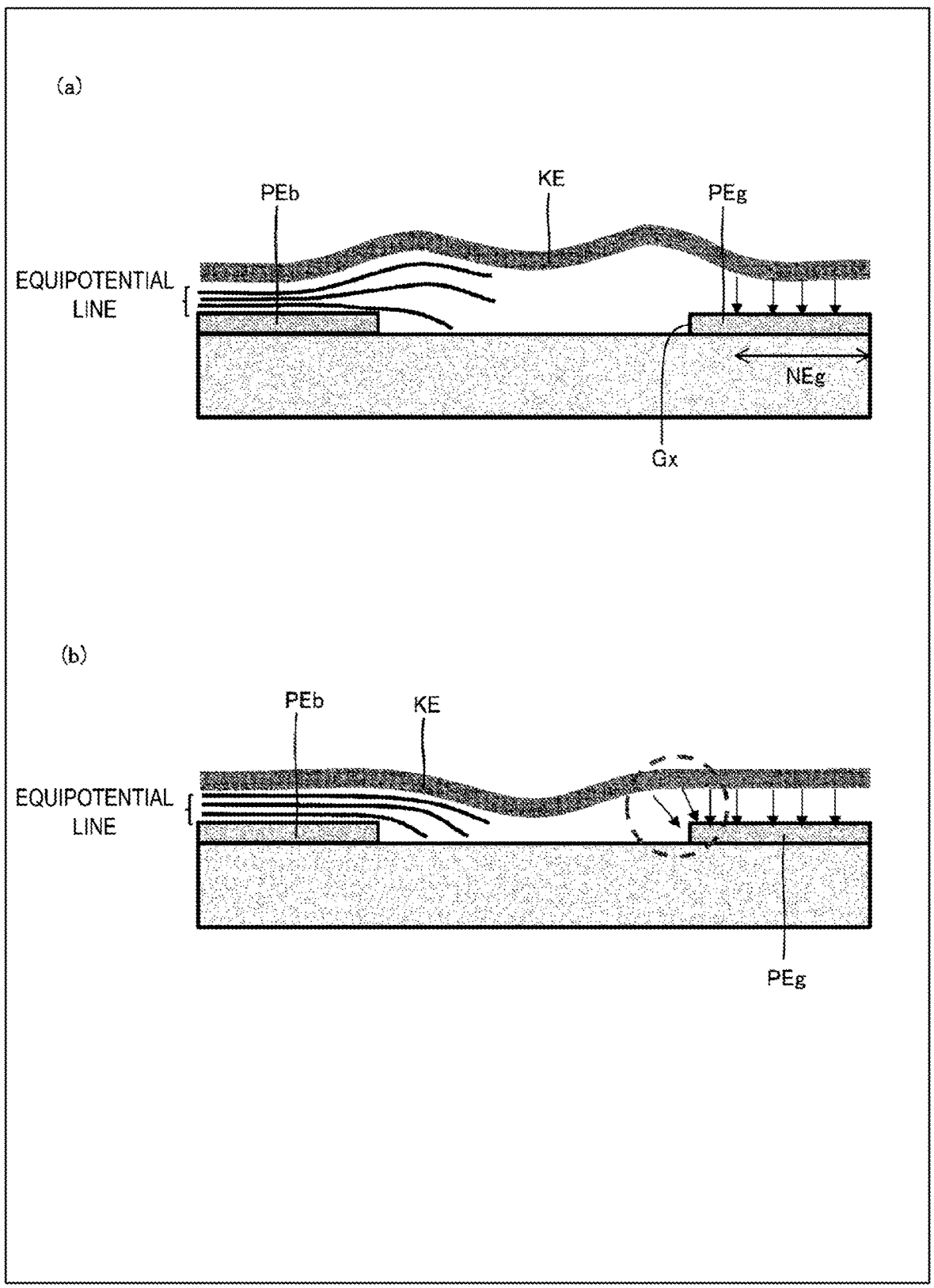
FIG. 3(a) is a schematic cross-sectional view illustrating an effect of Example 1.
FIG. 3(b) is a schematic cross-sectional view illustrating a comparative example.

FIG. 2 is a correspondence diagram of cross-sectional and plan views of a display device 2 according to Example 1. FIG. 3(a) is a schematic cross-sectional view illustrating an effect of Example 1, and FIG. 3(b) is a schematic cross-sectional view illustrating a comparative example.

Figure 12:
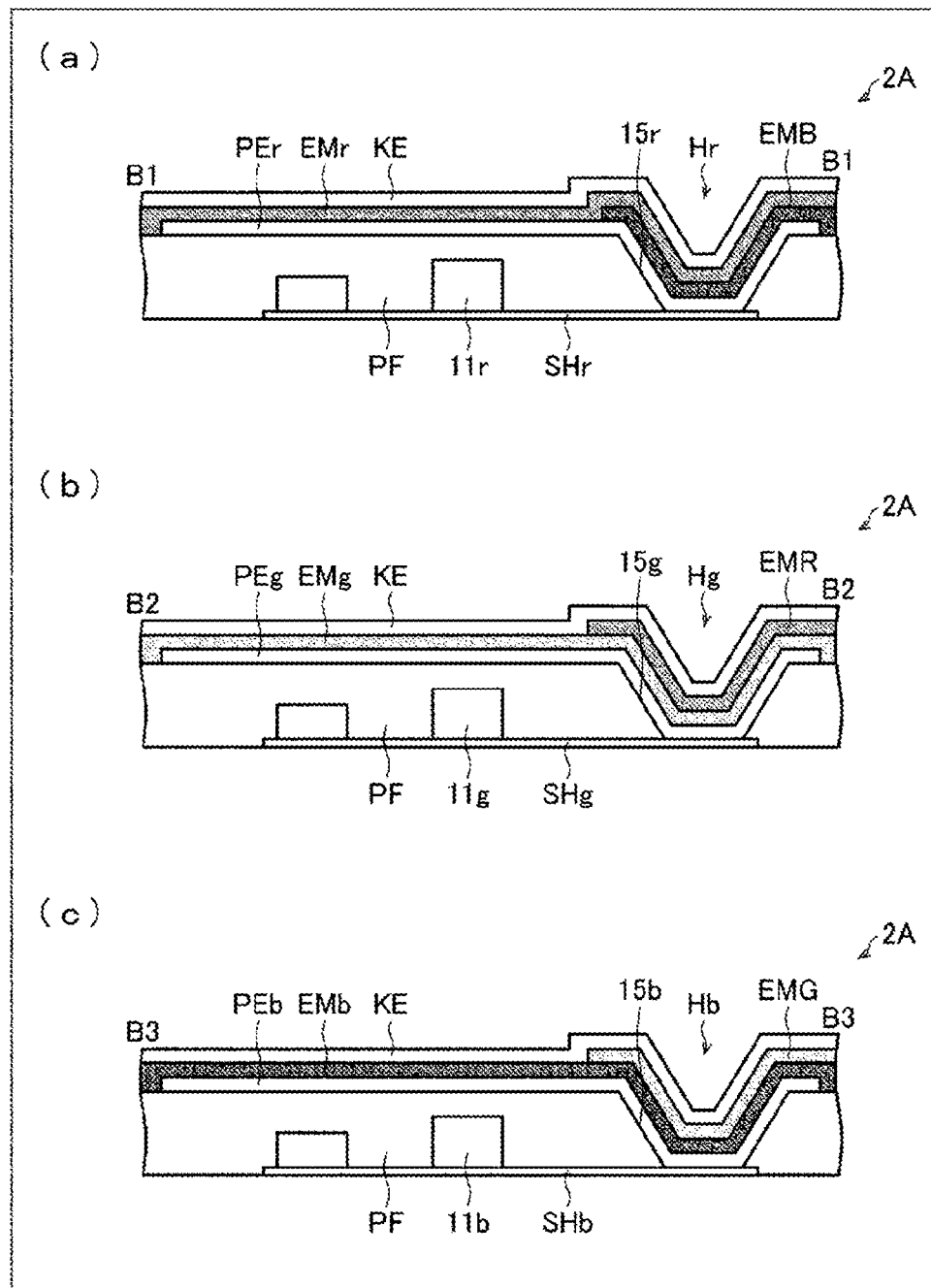
FIG. 12(a) is a cross-sectional view along a plane B1-B1 illustrated in FIG. 11.
FIG. 12(b) is a cross-sectional view along a plane B2-B2.
FIG. 12(c) is a cross-sectional view along a plane B3-B3.

In FIG. 2, a subpixel SPr emitting a red light, a subpixel SPg emitting a green light, and a subpixel SPb emitting a blue light are arranged in this order in a row direction (right-left direction). The subpixel SPg (second subpixel) includes a rectangular pixel electrode PEg (second pixel electrode). The subpixel SPr (first subpixel) including a rectangular pixel electrode PEr (first pixel electrode) and the subpixel SPb (third subpixel) including a rectangular pixel electrode PEb (third pixel electrode) are adjacent to the subpixel SPg. The pixel electrodes PEr, PEg, and PEb are formed on an organic insulating film PF (a flattening film made of polyimide or the like), which is an uppermost layer of the TFT layer 4, and are connected to TFTs 11r, 11g, and 11b (FIG. 12) formed in the TFT layer 4, respectively.

The EL layer 8 is provided with a light-emitting layer EMg (second light-emitting layer) overlapping the entire pixel electrode PEg, a light-emitting layer EMr (first light-emitting layer) overlapping the entire pixel electrode PEr, and a light-emitting layer EMb (third light-emitting layer) overlapping the entire pixel electrode PEb. In step S3 of FIG. 1, the light-emitting layers EMb and EMB emitting a blue light, the light-emitting layer EMg emitting a green light, and the light-emitting layers EMr and EMR emitting a red light are formed in this order, and the light-emitting layer EMg is upper than the light-emitting layers EMb and EMB, and lower than the light-emitting layers EMr and EMR. In the common electrode layer 9 in FIG. 1, a common electrode KE covering the light-emitting layers EMr, EMR, EMg, EMb, and EMB is formed. Note that, for example, r (lower-case letter) and R (upper-case letter) of EMr and EMR included in the reference symbols of the light-emitting layers are used in FIG. 2 to distinguish the same color light-emitting layers which appear separately in a plurality of rows, i.e., the same color light-emitting layers in the separated adjacent columns. Specifically, the light-emitting layer EMr and the light-emitting layer EMR are arranged not to be adjacent to each other but to be separate, and with a light-emitting layer of other color being interposed therebetween. The light-emitting layer EMg and the light-emitting layer EMG are arranged not to be adjacent to each other but to be separate, and with a light-emitting layer of other color being interposed therebetween. The light-emitting layer EMb and the light-emitting layer EMB are arranged not to be adjacent to each other but to be separate, and with a light-emitting layer of other color being interposed therebetween.

The light-emitting layer EMr is a quantum dot layer, and includes quantum dots, ligands, and photosensitive resin for emitting a red light. The light-emitting layer EMg is a quantum dot layer, and includes quantum dots, ligands, and photosensitive resin for emitting a green light. The light-emitting layer EMb is a quantum dot layer, and includes quantum dots, ligands, and photosensitive resin for emitting a blue light.

In each subpixel, the pixel electrode may function as an anode and the common electrode may function as a cathode, or the pixel electrode may function as a cathode and the common electrode may function as an anode.

In Example 1, an entire circumference of a peripheral edge portion EDg of the pixel electrode PEg overlaps with the light-emitting layer EMg and at least one of the light-emitting layer EMr and the light-emitting layer EMb. Specifically, the peripheral edge portion EDg of the pixel electrode PEg includes a portion overlapping the light-emitting layer EMg and the light-emitting layer EMr, a portion overlapping the light-emitting layer EMg and the light-emitting layer EMb, and a portion overlapping the light-emitting layer EMg, and the light-emitting layer EMr and the light-emitting layer EMb, and therefore, no current flows through the peripheral edge portion EDg (not contributing to green light emission). In the pixel electrode PEg, a valid portion NEg located inside the peripheral edge portion EDg overlaps only the light-emitting layer EMg, and does not overlap the light-emitting layer EMr and the light-emitting layer EMb, and therefore, a current flows through the valid portion NEg (contributing to green light emission).

An entire circumference of a peripheral edge portion EDr of the pixel electrode PEr overlaps the light-emitting layer EMr and at least one of the light-emitting layer EMB and the light-emitting layer EMg. Specifically, the peripheral edge portion EDr of the pixel electrode PEr includes a portion overlapping the light-emitting layer EMr and the light-emitting layer EMB, a portion overlapping the light-emitting layer EMr and the light-emitting layer EMg, and a portion overlapping the light-emitting layer EMr, and the light-emitting layer EMB and the light-emitting layer EMg, and therefore, no current flows through the peripheral edge portion EDr (not contributing to red light emission). In the pixel electrode PEr, a valid portion NEr located inside the peripheral edge portion EDr overlaps only the light-emitting layer EMr, and does not overlap the light-emitting layer EMg and the light-emitting layer EMB, and therefore, a current flows through the valid portion NEr (contributing to red light emission).

An entire circumference of a peripheral edge portion EDb of the pixel electrode PEb overlaps at least one of the light-emitting layer EMb and at least one of the light-emitting layer EMg and the light-emitting layer EMR. Specifically, the peripheral edge portion EDb of the pixel electrode PEb includes a portion overlapping the light-emitting layer EMb and the light-emitting layer EMg, a portion overlapping the light-emitting layer EMb and the light-emitting layer EMR, and a portion overlapping the light-emitting layer EMb, and the light-emitting layer EMg and the light-emitting layer EMR, and therefore, no current flows through the peripheral edge portion EDb (not contributing to blue light emission). In the pixel electrode PEb, a valid portion NEb located inside the peripheral edge portion EDb overlaps only the light-emitting layer EMb, and does not overlap the light-emitting layer EMg and the light-emitting layer EMR, and therefore, a current flows through the valid portion NEb (contributing to blue light emission).

In Example 1, the plurality of light-emitting layers (multiple light-emitting layers) overlapping the peripheral edge portions of the pixel electrodes PEr, PEg, and PEb function as an edge cover (an insulating film covering an edge of the pixel electrode), a phenomenon in which the edge of the pixel electrode deteriorates (the so-called subpixel shrink) can be suppressed. Since the edge cover is not required to be formed, the number of processes is reduced, and the valid portions NEr, NEg, and NEb of the pixel electrodes are not degraded.

In FIG. 2, an area of the valid portion NEg of the pixel electrode PEg<an area of the valid portion NEr of the pixel electrode PEr<an area of the valid portion NEb of the pixel electrode PEb, and an area of a light-emitting region EAg of the subpixel SPg (green)<an area of a light-emitting region EAr of the subpixel SPr (red)<an area of a light-emitting region EAb of the subpixel SPb (blue). In this configuration, a current density in the valid portion NEb of the pixel electrode PEb can be reduced, and a service life of the blue subpixel SPb, which is generally prone to degradation, can be extended.

A gap between the pixel electrodes PEg and PEr overlaps at least the light-emitting layers EMg and EMr, and a width d1 of this gap is greater than a distance h1 between the organic insulating film PF and the common electrode KE in this gap. This can eliminate a leakage current between the pixel electrodes PEg and PEr.

Furthermore, h1>a thickness T of the pixel electrode PEg, and as illustrated in FIG. 3(a), the common electrode KE has a shape convex downward over the pixel electrode PEg. In this configuration, a distance to the common electrode KE is longer over an edge Gx than over near the valid portion NEg of the pixel electrode PEg, so an electric field does not concentrate at an end of the valid portion NEg (an overcurrent does not flow), and the shrink of the light-emitting region EAg can be prevented. Note that as illustrated in FIG. 3(b), if the distance to the common electrode KE is shorter over near the edge than over the valid portion of the pixel electrode PEg, the electric field may concentrate at the end of the valid portion (overcurrent flows), and the light-emitting region may shrink.

In a planar view, a distance (non-light-emitting width) from the edge Gx of the pixel electrode PEg to the light-emitting region EAg of the subpixel SPg is smaller than a width (length in the row direction) of the light-emitting region EAg, and thereby, the light-emitting region EAg is widened to ensure a luminance of the subpixel SPg.

In FIG. 2, a gap between the pixel electrodes PEr and PEb overlaps the light-emitting layers EMB and EMr, a width d2 of this gap is greater than a distance h2 between the organic insulating film PF and the common electrode KE in this gap, and h2>a thickness T of the pixel electrode PEr. The common electrode KE has a shape convex downward over the pixel electrode PEr. In a planar view, a distance (non-light-emitting width) from an edge Rx of the pixel electrode PEr to the light-emitting region EAr of the subpixel SPr is smaller than a width of the light-emitting region EAr.

A gap between the pixel electrodes PEg and PEb overlaps the light-emitting layers EMb and EMg, and a width d3 of this gap is greater than a distance h3 between the organic insulating film PF and the common electrode KE in this gap, and h3>a thickness T of the pixel electrode PEb. The common electrode KE has a shape convex downward over the pixel electrode PEb. In a planar view, a distance (non-light-emitting width) from an edge Bx of the pixel electrode PEb to the light-emitting region EAb of the subpixel SPb is smaller than a width of the light-emitting region EAb.

Figure 4:
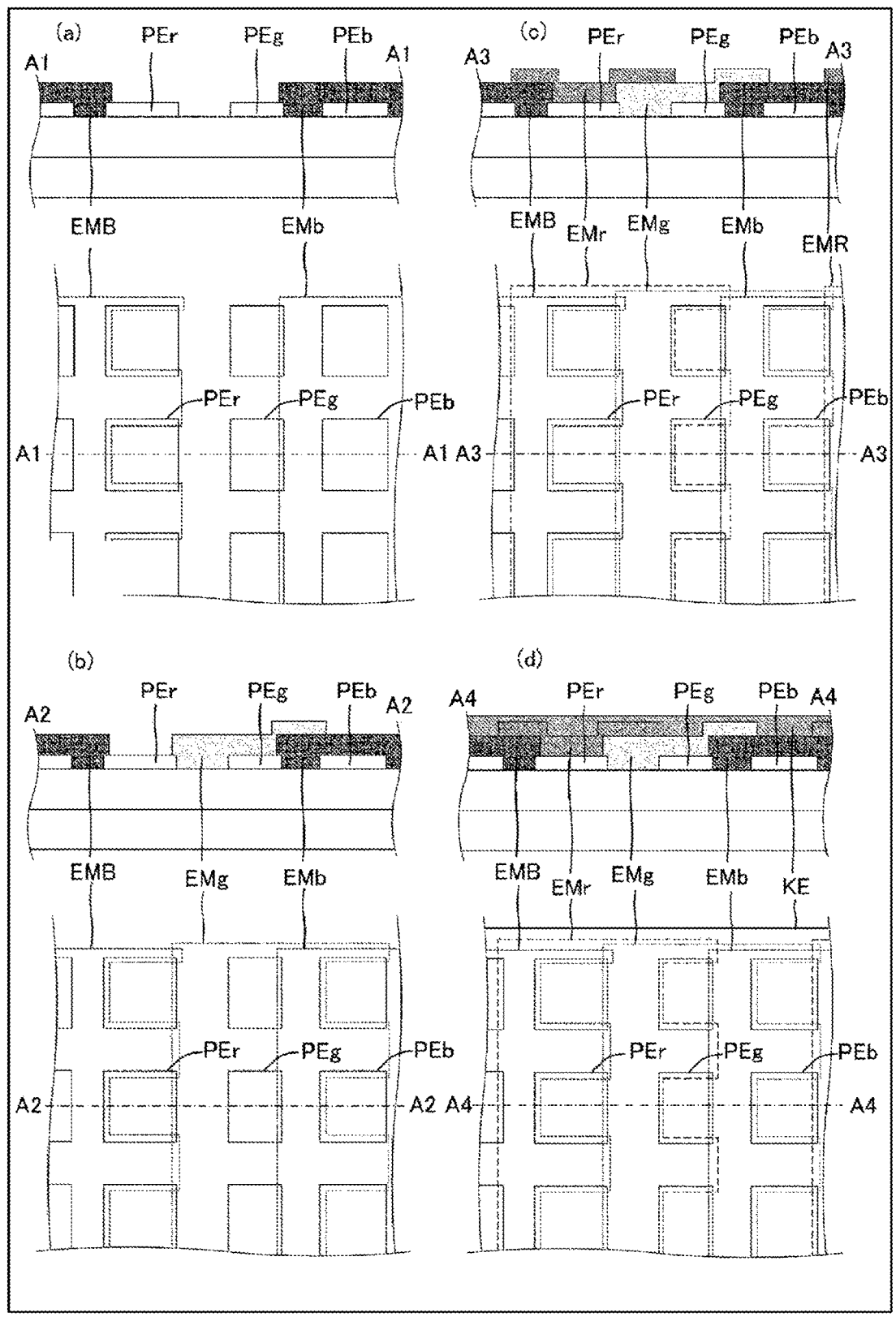
FIGS. 4(a) to 4(d) are correspondence diagrams of cross-sectional and plan views illustrating a process for forming an EL layer and a common electrode layer in Example 1.
Figure 5:
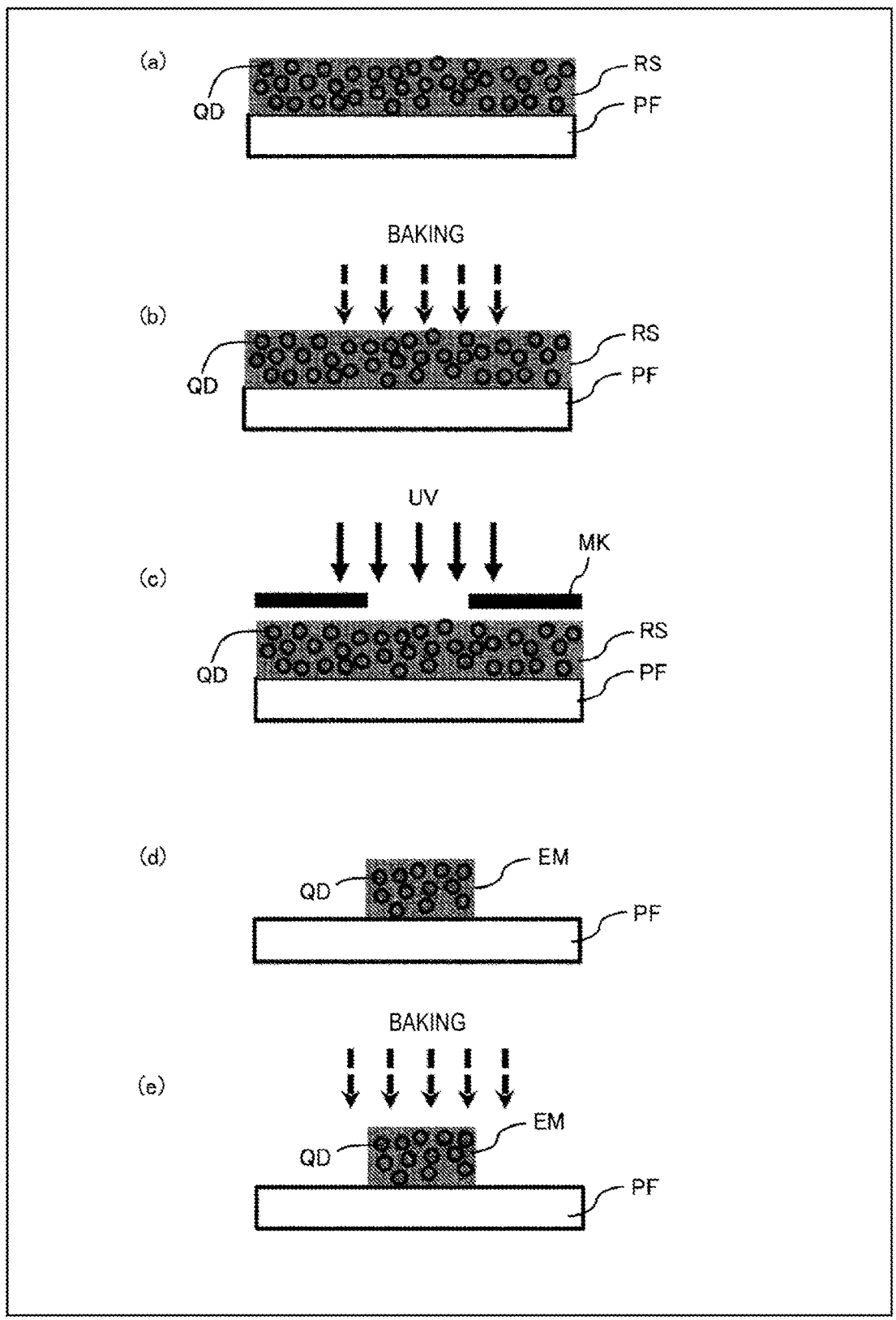
FIGS. 5(a) to 5(e) are schematic cross-sectional views illustrating a process for patterning the EL layer.

FIG. 4 is a correspondence diagram of cross-sectional and plan views illustrating a process for forming the EL layer and the common electrode layer in Example 1. FIG. 5 is a schematic cross-sectional view illustrating a process for patterning the EL layer.

In forming the EL layer 8, first, the blue light-emitting layer EMb overlapping the entire pixel electrode PEb as illustrated in FIG. 4(a) and a plurality of blue light-emitting layers (including the light-emitting layer EMB) separated from the light-emitting layer EMb are pattern formed. Next, as illustrated in FIG. 4(b), the green light-emitting layer EMg overlapping the entire pixel electrode PEg and a plurality of green light-emitting layers (not illustrated) separated from the light-emitting layer EMg are pattern formed. Next, as illustrated in FIG. 4(c), the light-emitting layer EMr overlapping the entire pixel electrode PEr and a plurality of red light-emitting layers (not illustrated) separated from the light-emitting layer EMr are pattern formed. Next, as illustrated in FIG. 4(d), the common electrode KE covering the light-emitting layers EMb, EMg, and EMr is formed. As illustrated in FIG. 4, planar shapes of the blue light-emitting layer EMb, the green light-emitting layer EMg, and the red light-emitting layer EMr are different from each other.

Since an order of a size of an emission wavelength matches an order of a size of a particle diameter of the quantum dot, by forming the blue light-emitting layer, the green light-emitting layer, and the red light-emitting layer in this order, the plurality of light-emitting layers overlapping the peripheral edge portion of the pixel electrode are configured such that, as illustrated in FIG. 4, a light-emitting layer having a larger emission wavelength (a larger particle size of the quantum dot) is positioned in an upper layer than a light-emitting layer having a smaller emission wavelength (a smaller particle size of the quantum dot). This can solve problems such as the quantum dots in the light-emitting layer of the upper layer fall into the gaps of the quantum dots in the light-emitting layer of the lower layer.

The light-emitting layer (EMb, EMg, EMr) can be pattern formed as follows. First, as illustrated in FIG. 5(a), a photosensitive resin (resist) RS containing quantum dots and ligands is applied on the organic insulating film PF (application thickness is, for example, 20 to 100 nm). Next, as illustrated in FIG. 5(b), the applied resist RS is prebaked at 80 to 120° C. to evaporate a solvent and dry a coating film. Next, as illustrated in FIG. 5(c), the dried resist RS is subjected to UV exposure over a mask MK (exposure intensity is, for example, 10 to 1000 [mJ/cm2]). Next, as illustrated in FIG. 5(d), the resultant is developed using an alkali solution, organic solvent, water, or the like (where a UV irradiated portion dissolves in a positive-working resist, and a UV non-irradiated portion dissolves in the negative-working resist) to obtain a pattern formed light-emitting layer EM. Thereafter, main baking is performed as necessary at 100 to 200° C., for example, as illustrated in FIG. 5(e). The main baking suppresses gas release from the photosensitive resin.

Figure 6:
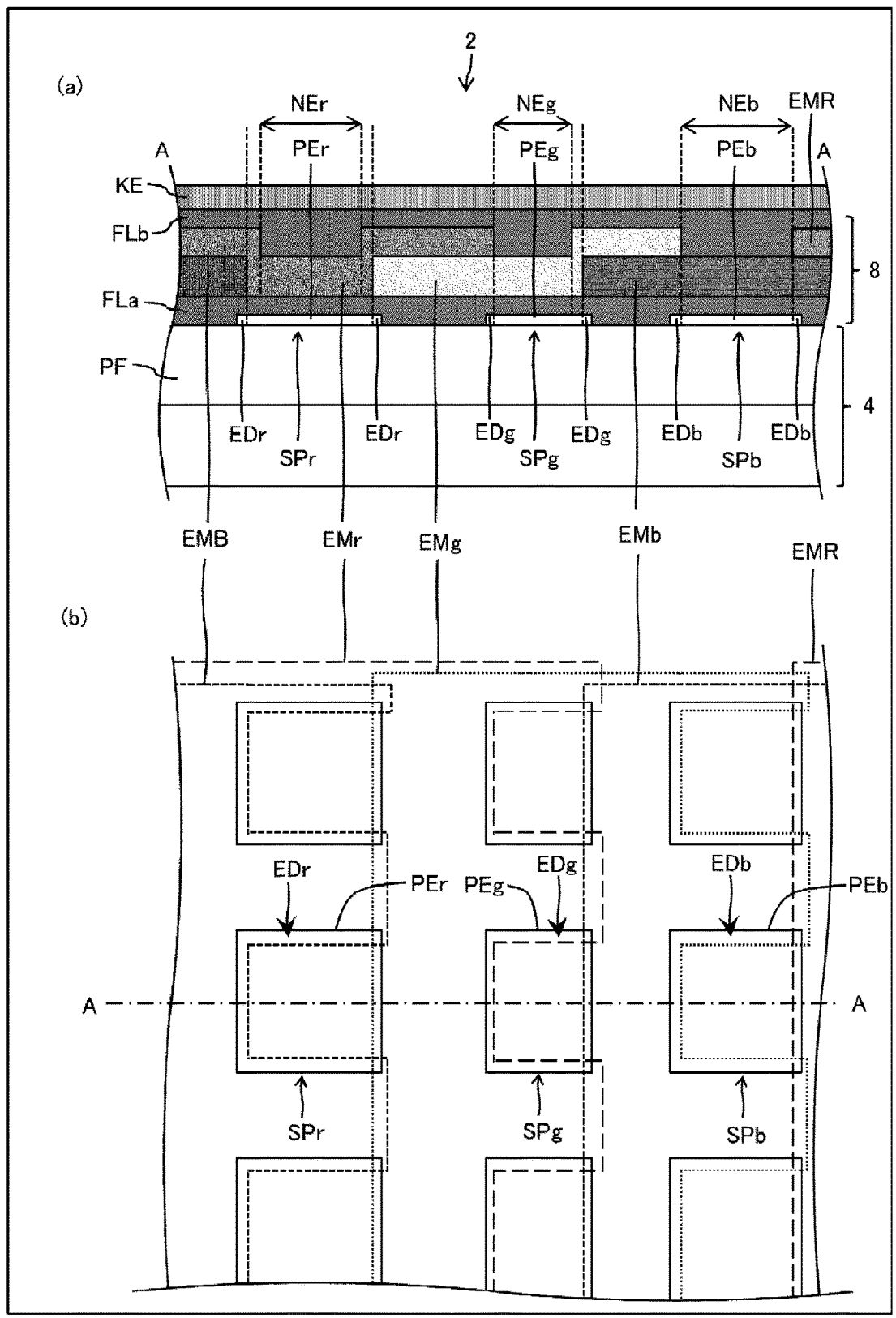
FIG. 6 is a correspondence diagram of cross-sectional and plan views illustrating a modification example of Example 1.

FIG. 6 is a correspondence diagram of cross-sectional and plan views illustrating a modification example of Example 1. As illustrated in FIG. 6, the EL layer 8 may be provided with a lower function layer FLa and an upper function layer FLb, which are common layers between the plurality of subpixels. In this case, the lower function layer FLa, the light-emitting layer EMg, the upper function layer FLb, and the common electrode KE are layered in this order on the valid portion NEg of the pixel electrode PEg, the lower function layer FLa, the light-emitting layer EMr, the upper function layer FLb, and the common electrode KE are layered in this order on the valid portion NEr of the pixel electrode PEr, and the lower function layer FLa, the light-emitting layer EMb, the upper function layer FLb, and the common electrode KE are layered in this order on the valid portion NEb of the pixel electrode PEb. In a normal structure in which the pixel electrode functions as the anode and the common electrode functions as the cathode, the lower function layer FLa may include a hole injection layer and a hole transport layer, and the upper function layer FLb may include an electron injection layer and an electron transport layer. In an inverter structure in which the pixel electrode functions as the cathode and the common electrode functions as the anode, the lower function layer FLa may include an electron injection layer and an electron transport layer, and the upper function layer FLb may include a hole injection layer and a hole transport layer.

In FIG. 6, the lower function layer FLa is formed in a solid-like form to contact the entire pixel electrode PEg, the entire pixel electrode PEr, and the entire pixel electrode PEb, and gaps between adjacent pixel electrodes are filled with the lower function layer FLa.

Example 2

Figure 7:
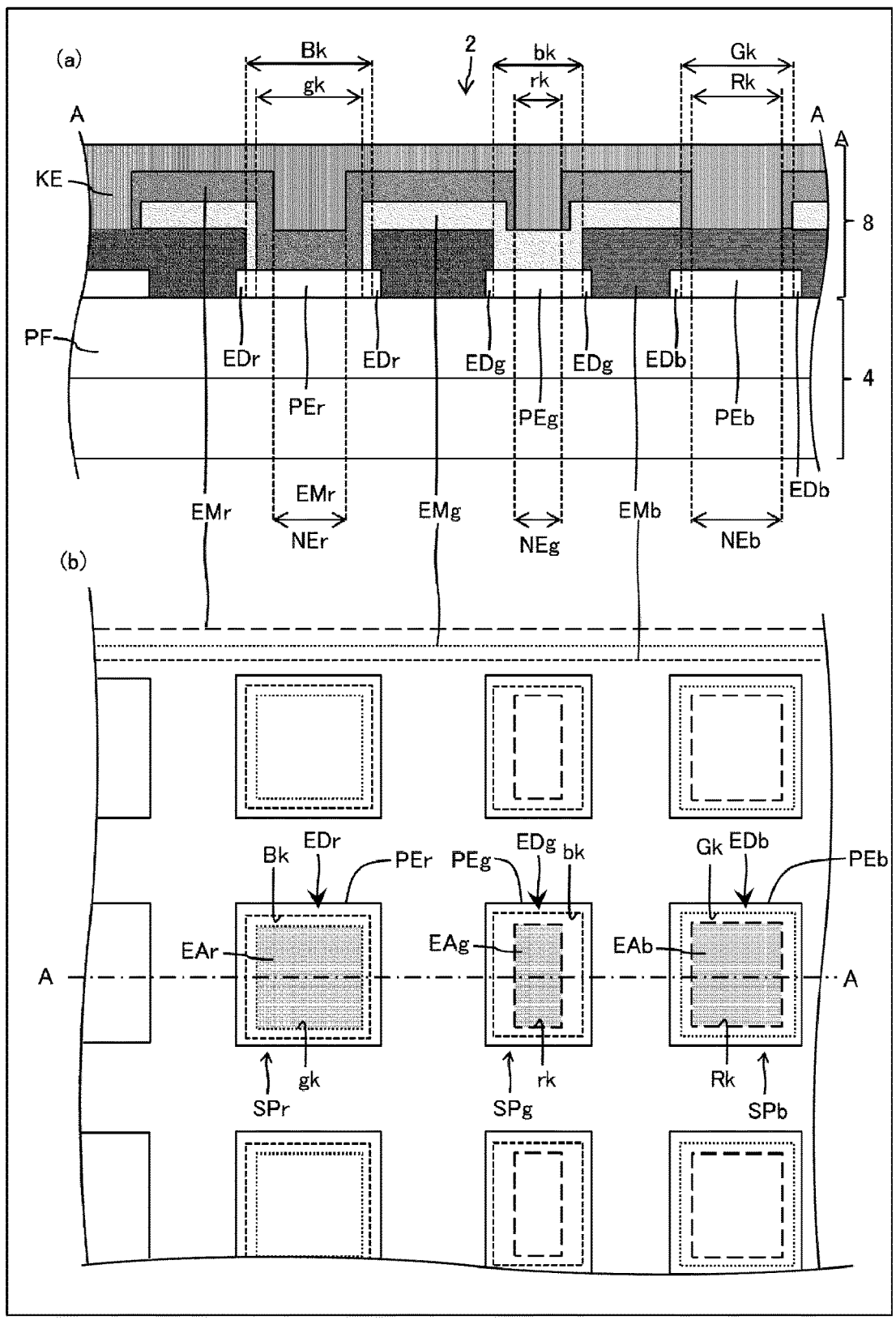
FIG. 7 is a correspondence diagram of cross-sectional and plan views of a display device according to Example 2.

FIG. 7 is a correspondence diagram of cross-sectional and plan views of a display device 2 according to Example 2. In Example 2, formed in the order from a lower layer side are the (blue) light-emitting layer EMb overlapping the entire pixel electrode PEb, the (green) light-emitting layer EMg overlapping the entire pixel electrode PEg, and the (red) light-emitting layer EMr overlapping the entire pixel electrode PEr. The light-emitting layers EMb. EMg, and EMr are formed in a solid-like form across the entire display region, and the light-emitting layer EMb is provided with an opening bk overlapping with the pixel electrode PEg and an opening Bk overlapping the pixel electrode PEr, the light-emitting layer EMg is provided with an opening gk overlapping the pixel electrode PEr and an opening Gk overlapping the pixel electrode PEb, and the light-emitting layer EMr is provided with an opening rk overlapping with the pixel electrode PEg and an opening Rk overlapping the pixel electrode PEb.

In FIG. 7, the opening bk overlaps the entire opening rk, the pixel electrode PEg overlaps the entire opening rk and the entire opening bk, and the entire circumference of the peripheral edge portion EDg of the pixel electrode PEg overlaps the light-emitting layer EMg, and the light-emitting layer EMr and the light-emitting layer EMb, and therefore, no current flows through the peripheral edge portion EDg (not contributing to green light emission). In the pixel electrode PEg, the valid portion NEg located inside the peripheral edge portion EDg overlaps only the light-emitting layer EMg, and does not overlap the light-emitting layer EMr and the light-emitting layer EMb, and therefore, a current flows through the valid portion NEg (contributing to green light emission).

The opening Bk overlaps the entire opening gk, the pixel electrode PEr overlaps the entire opening gk and the entire opening Bk, and the entire circumference of the peripheral edge portion EDr of the pixel electrode PEr overlaps the light-emitting layer EMr, and the light-emitting layer EMg and the light-emitting layer EMb, and therefore, no current flows through the peripheral edge portion EDr (not contributing to red light emission). In the pixel electrode PEr, the valid portion NEr located inside the peripheral edge portion EDr overlaps only the light-emitting layer EMr, and does not overlap the light-emitting layer EMg and the light-emitting layer EMb, and therefore, a current flows through the valid portion NEr (contributing to red light emission).

The opening Gk overlaps the entire opening Rk, the pixel electrode PEb overlaps the entire opening Rk and the entire opening Gk, and the entire circumference of the peripheral edge portion EDb of the pixel electrode PEb overlaps the light-emitting layer EMb, and the light-emitting layer EMg and the light-emitting layer EMr, and therefore, no current flows through the peripheral edge portion EDb (not contributing to blue light emission). In the pixel electrode PEb, the valid portion NEb located inside the peripheral edge portion EDb overlaps only the light-emitting layer EMb, and does not overlap the light-emitting layer EMg and the light-emitting layer EMr, and therefore, a current flows through the valid portion NEb (contributing to blue light emission).

In Example 2, the order of layering three light-emitting layers overlapping the peripheral edge portion of the pixel electrode (the light-emitting layer EMb, the light-emitting layer EMg, and the light-emitting layer EMr in the order from the lower layer side) are identical throughout the entire circumference of the peripheral edge portion, and an edge of the light-emitting layer on the lower layer side of two light-emitting layers in contact with each other is covered with the light-emitting layer on the upper layer side. In other words, the light-emitting layer EMg covers the edge of the light-emitting layer EMb (including around the openings Bk and bk), and the light-emitting layer EMr covers the edge of the light-emitting layer EMg (including around the openings Gk and gk).

Shapes of the opening bk and the opening BK are different from each other for the light-emitting layer EMb, shapes of the opening gk and the opening GK are different from each other for the light-emitting layer EMg, and shapes of the opening rk and the opening RK are different from each other for the light-emitting layer EMr, and the area of the valid portion NEg of the pixel electrode PEg<the area of the valid portion NEr of the pixel electrode PEr<the area of the valid portion NEb of the pixel electrode PEb.

In Example 2, since the peripheral edge of the pixel electrode overlaps three light-emitting layers, degradation of the peripheral edge portion can be more reliably suppressed.

Each of the light-emitting layers EMb, EMg, and EMr is formed in a solid-like form (continuously) across the entire display region, and is provided with two types of openings having different shapes. Therefore, a ground contact area between the light-emitting layer and an underlayer is wide (the adhesive strength of the light-emitting layer is high), and the light-emitting layer does not easily peel off. In an island-shaped lone pattern, a portion of 270° of an outer periphery of a corner is subjected to the processing process, but in a continuous solid-like pattern having openings, a portion of 90° of an inner periphery of a corner of the opening is subjected to the processing process, so the corner of the light-emitting layer can be prevented from peeling.

Figure 8:
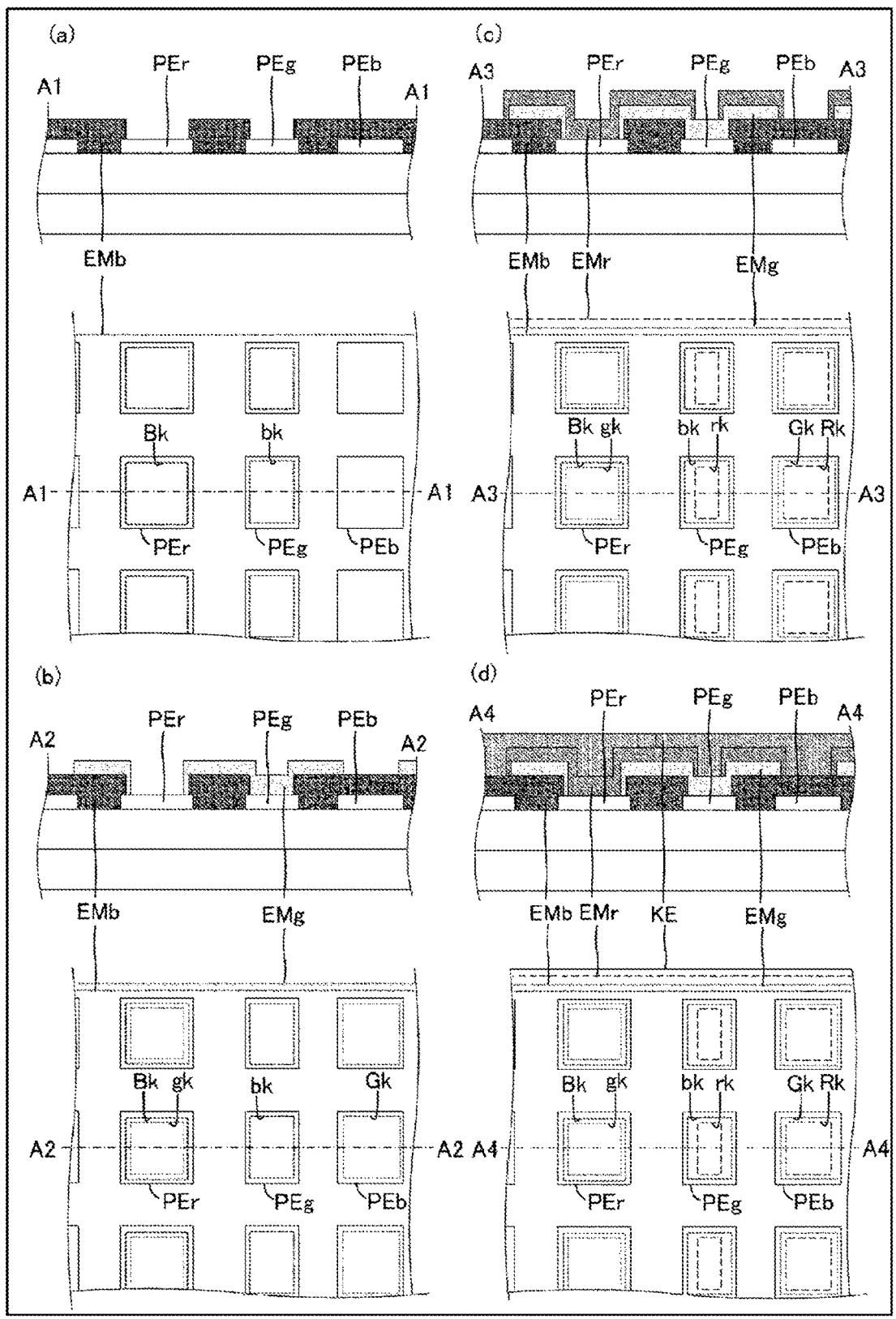
FIGS. 8(a) to 8(d) are correspondence diagrams of cross-sectional and plan views illustrating a process for forming an EL layer and a common electrode layer in Example 2.

FIGS. 8(a) to 8(d) are correspondence diagrams of cross-sectional and plan views illustrating a process for forming the EL layer and the common electrode layer in Example 2. In forming the EL layer 8, first, the (blue) light-emitting layer EMb overlapping the entire pixel electrode PEb as illustrated in FIG. 8(a) is film formed across the entire display region to form the openings Bk and bk. Next, the (green) light-emitting layer EMg overlapping the entire pixel electrode PEg as illustrated in FIG. 8(b) is film formed across the entire display region to form the openings Gk and gk. Next, the (red) light-emitting layer EMr overlapping the entire pixel electrode PEr as illustrated in FIG. 8(c) is film formed across the entire display region to form the openings Rk and rk. Next, as illustrated in FIG. 8(d), the common electrode KE covering the light-emitting layer EMr is formed.

Figure 9:
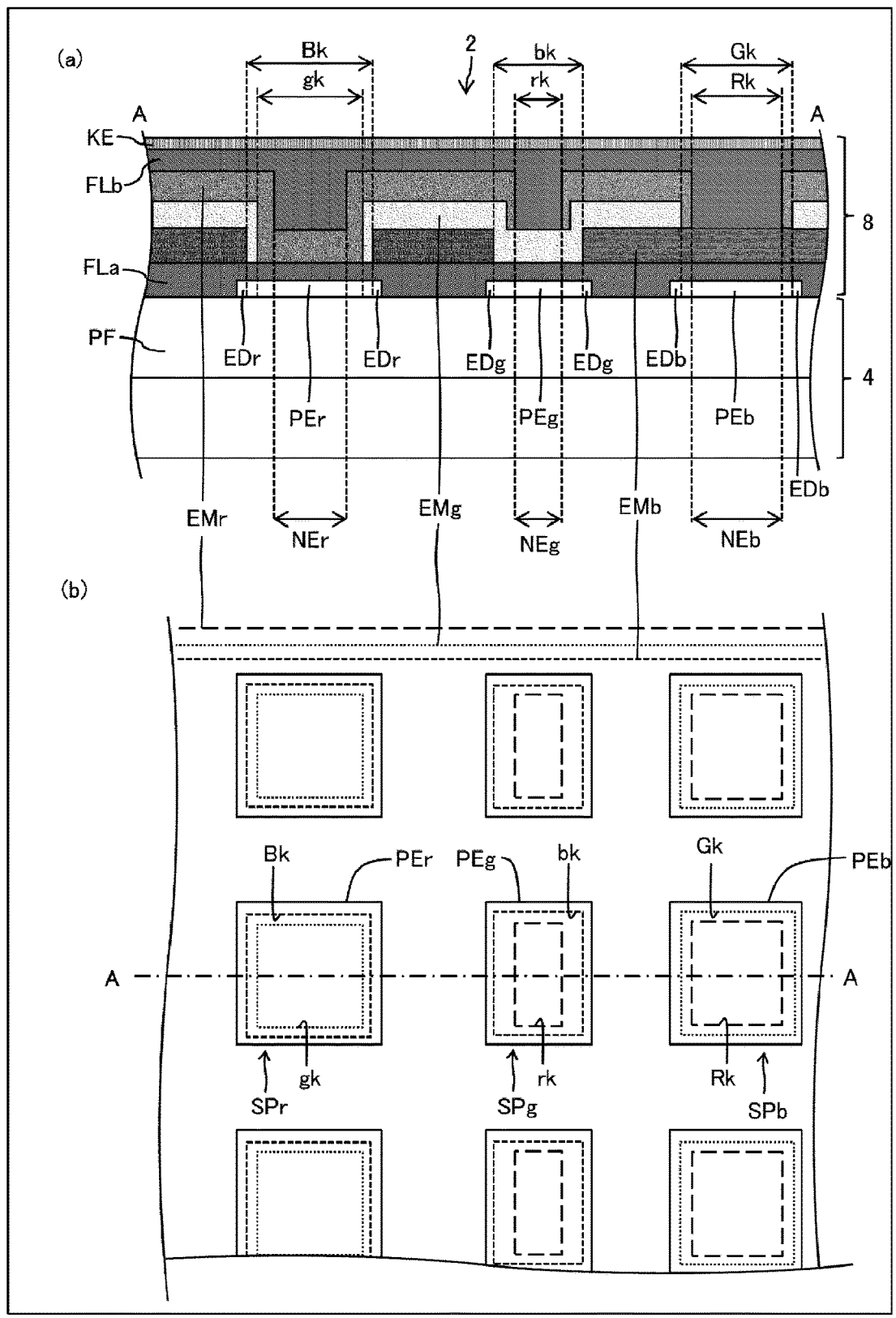
FIG. 9 is a correspondence diagram of cross-sectional and plan views illustrating a modification example of Example 2.

FIG. 9 is a correspondence diagram of cross-sectional and plan views illustrating a modification example of Example 2. As illustrated in FIG. 9, the lower function layer FLa covering the pixel electrodes PEg, PEr, and PEb may be provided to a lower layer than the light-emitting layer EMb, and the upper function layer FLb covering the light-emitting layers EMr, EMg, and EMb may be provided to a lower layer than the common electrode KE.

Figure 10:
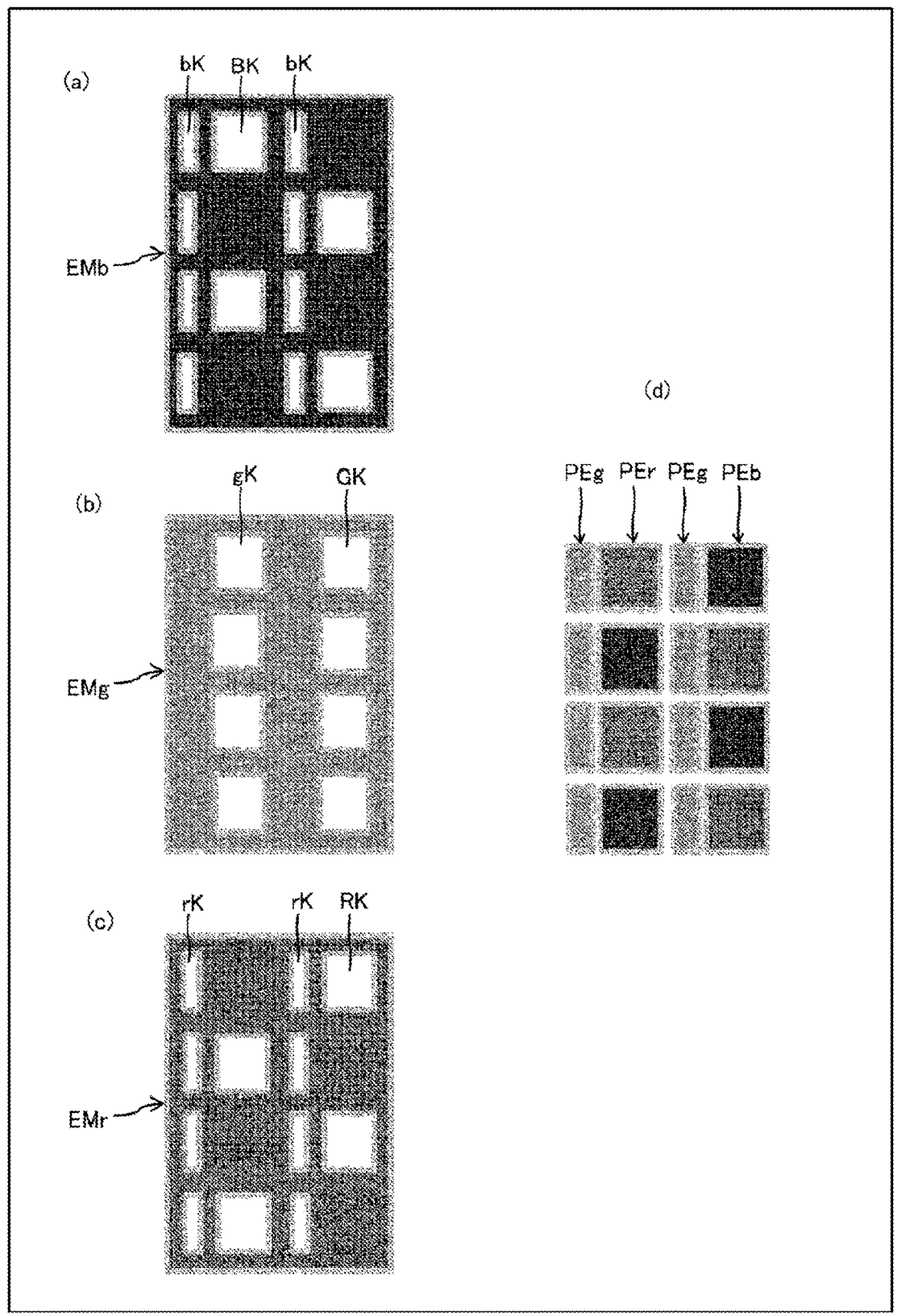
FIG. 10 is a correspondence diagram of cross-sectional and plan views illustrating another modification example of Example 2.

FIG. 10 is a correspondence diagram of cross-sectional and plan views illustrating another modification example of Example 2. As in FIG. 10(d), a PenTile display device includes one red subpixel (including pixel electrodes PEr), two green subpixels (including pixel electrode PEg), and one blue subpixel (including pixel electrode PEb) in two pixel regions. In the blue light-emitting layer EMb across the entire display region (see FIG. 10(a)), the opening bk overlapping the pixel electrode PEg and the opening BK overlapping the pixel electrode PEr are formed. In the green light-emitting layer EMg across the entire display region (see FIG. 10(b)), the opening gk overlapping the pixel electrode PEr and the opening GK overlapping the pixel electrode PEb are formed. In the red light-emitting layer EMr across the entire display region (see FIG. 10(c)), the opening rk overlapping the pixel electrode PEg and the opening RK overlapping the pixel electrode PEb are formed. The blue light-emitting layer EMb, the green light-emitting layer EMg, and the red light-emitting layer EMr may be layered in this order for forming the display device. In the case of FIG. 10 also, three light-emitting layers EMb, EMg, and EMr overlap in this order in the peripheral edge portions of the pixel electrodes PEr, PEg, and PEb, and these three light-emitting layers function as edge covers.

Example 3

Figure 11:
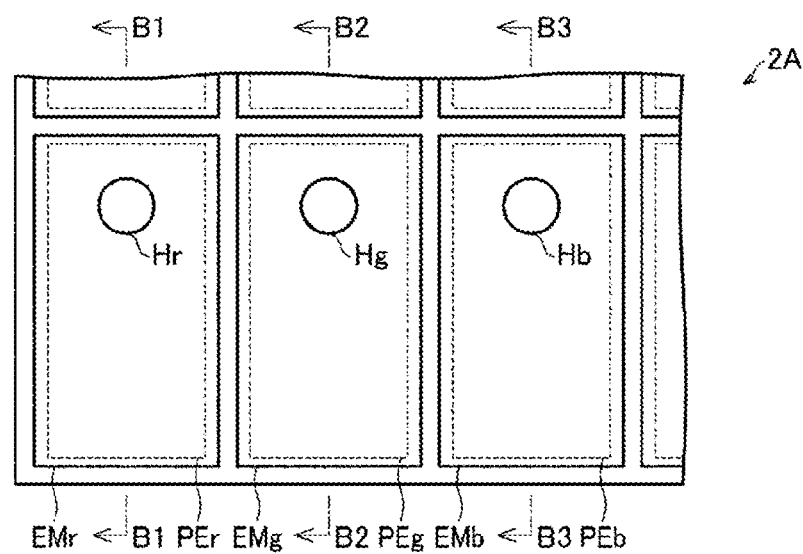
FIG. 11 is a plan view illustrating a display device according to Example 3.

FIG. 11 is a plan view illustrating a display device 2A according to Example 3. FIG. 12(a) is a cross-sectional view along a plane B1-B1 illustrated in FIG. 11, FIG. 12(b) is a cross-sectional view along a plane B2-B2, and FIG. 12(c) is a cross-sectional view along a plane B3-B3.

In Example 3, at least two of the light-emitting layers EMr, EMg, and EMb overlap one on top of another at least in inclined faces 15r, 15g, and 15b of contact holes Hr, Hg, and Hb of the organic insulating film PF.

The contact hole Hr (first contact hole) having the inclined face 15r (first inclined face) in the organic insulating film PF covering a TFT 11r (first TFT) for driving the red pixel is formed as illustrated in FIG. 12(a) and FIG. 11. Then, the pixel electrode PEr (first pixel electrode) is formed along the inclined face 15r of the contact hole Hr and a surface of the organic insulating film PF. An intra-pixel wiring line SHr (first intra-pixel wiring line) coupled to the TFT 11r is electrically connected to the pixel electrode PEr within the contact hole Hr. The red light-emitting layer EMr (first light-emitting layer) is formed on the organic insulating film PF to cover the pixel electrode PEr.

Then, the blue light-emitting layer EMB (second light-emitting layer) is formed between the red light-emitting layer EMr and the organic insulating film PF to overlap the red light-emitting layer EMr at least in the inclined face 15r of the contact hole Hr.

As illustrated in FIG. 12(b) and FIG. 11, the contact hole Hg (first contact hole) having the inclined face 15g (first inclined face) is formed in the organic insulating film PF covering the TFT 11g (first TFT) for driving the green pixel. Then, the pixel electrode PEg (first pixel electrode) is formed along the inclined face 15g of the contact hole Hg and the surface of the organic insulating film PF. An intra-pixel wiring line SHg (first intra-pixel wiring line) coupled to the TFT 11g is electrically connected to the pixel electrode PEg within the contact hole Hg. The green light-emitting layer EMg (first light-emitting layer) is formed on the organic insulating film PF to cover the pixel electrode PEg.

Then, the red light-emitting layer EMR (second light-emitting layer) is formed between the green light-emitting layer EMg and the common electrode KE to overlap the green light-emitting layer EMg at least in the inclined face 15g of the contact hole Hg.

As illustrated in FIG. 12(c) and FIG. 11, the contact hole Hb (first contact hole) having the inclined face 15b (first inclined face) is formed in the organic insulating film PF covering the TFT 11b (first TFT) for driving the blue pixel. Then, the pixel electrode PEb (first pixel electrode) is formed along the inclined face 15b of the contact hole Hb and the surface of the organic insulating film PF. An intra-pixel wiring line SHb (first intra-pixel wiring line) coupled to the TFT 11b is electrically connected to the pixel electrode PEb within the contact hole Hb. The blue light-emitting layer EMb (first light-emitting layer) is formed on the organic insulating film PF to cover the pixel electrode PEb.

Then, the green light-emitting layer EMG (second light-emitting layer) is formed between the blue light-emitting layer EMb and the common electrode KE to overlap the blue light-emitting layer EMb at least in the inclined face 15b of the contact hole Hb.

The organic insulating film PF (flattening film) is formed to cover the TFTs 11r, 11g, and 11b for driving the pixels, and concave and convex of the surface of the organic insulating film PF excluding the region of the contact holes Hr, Hg, and Hb is smaller than a maximum height difference of the TFTs 11r, 11g, and 11b for driving the pixels. The organic insulating film PF is formed of an insulator, and reduces a parasitic capacitance between the pixel electrodes PEr, PEg, and PEb, and the intra-pixel wiring lines SHr, SHg, and SHb. The contact holes Hr, Hg, or Hb corresponding to each pixel is formed in the organic insulating film PF.

At bottoms of the respective contact holes Hr, Hg, and Hb, the pixel electrodes PEr, PEg, and PEb are electrically connected to the intra-pixel wiring lines SHr, SHg, and SHb coupled to the TFTs 11r, 11g, and 11b for driving the pixels, respectively.

In this manner, two types of light-emitting layers EMB and EMr having different luminescent colors are layered in contact with each other so as to cover the contact hole Hr. Two types of light-emitting layers EMg and EMR having different luminescent colors are layered in contact with each other so as to cover the contact holes Hg. Two types of light-emitting layers EMb and EMG having different luminescent colors are layered in contact with each other so as to cover the contact hole Hb.

The pixel electrodes PEr, PEg, and PEb are formed on the surface of the organic insulating film PF in a pixel-to-pixel division manner. The pixel electrode PEr covers the corresponding contact hole Hr and is electrically connected to the driving TFT 11r via the intra-pixel wiring line SHr. The pixel electrode PEg covers the corresponding contact hole Hg and is electrically connected to the driving TFT 11g via the intra-pixel wiring line SHg. The pixel electrode PEb covers the corresponding contact hole Hb and is electrically connected to the driving TFT 11b via the intra-pixel wiring line SHb.

The common electrode KE is formed across a plurality of pixels.

The light-emitting layers EMr, EMg, and EMb, and the light-emitting layers EMR, EMG, and EMB include quantum dots and emit light when a current is applied. As illustrated in FIG. 11, the edge of the light-emitting layer EMr is located outside the edge of the pixel electrode PEr, the edge of the light-emitting layer EMg is located outside the edge of the pixel electrode PEg, and the edge of the light-emitting layer EMb is located outside the edge of the pixel electrode PEb.

One of the pixel electrodes PEr, PEg, PRb, and the common electrode KE has visible optical transparency. A work function of the pixel electrode PEr, PEg, or PRb and a work function of the common electrode KE may be different from each other. A charge transport layer and a charge injection layer may be provided on or below the light-emitting layers EMr, EMg, and EMb. The charge transport layer and the charge injection layer continuously cover the plurality of pixels and the light-emitting layers layered portion. A plurality of types of luminescent color pixels are disposed adjacent to each other in the display device 2A. A distance between a pixel electrode and an adjacent pixel electrode is sufficiently greater than the shortest distance between the common electrode and the pixel electrode.

Figure 13:
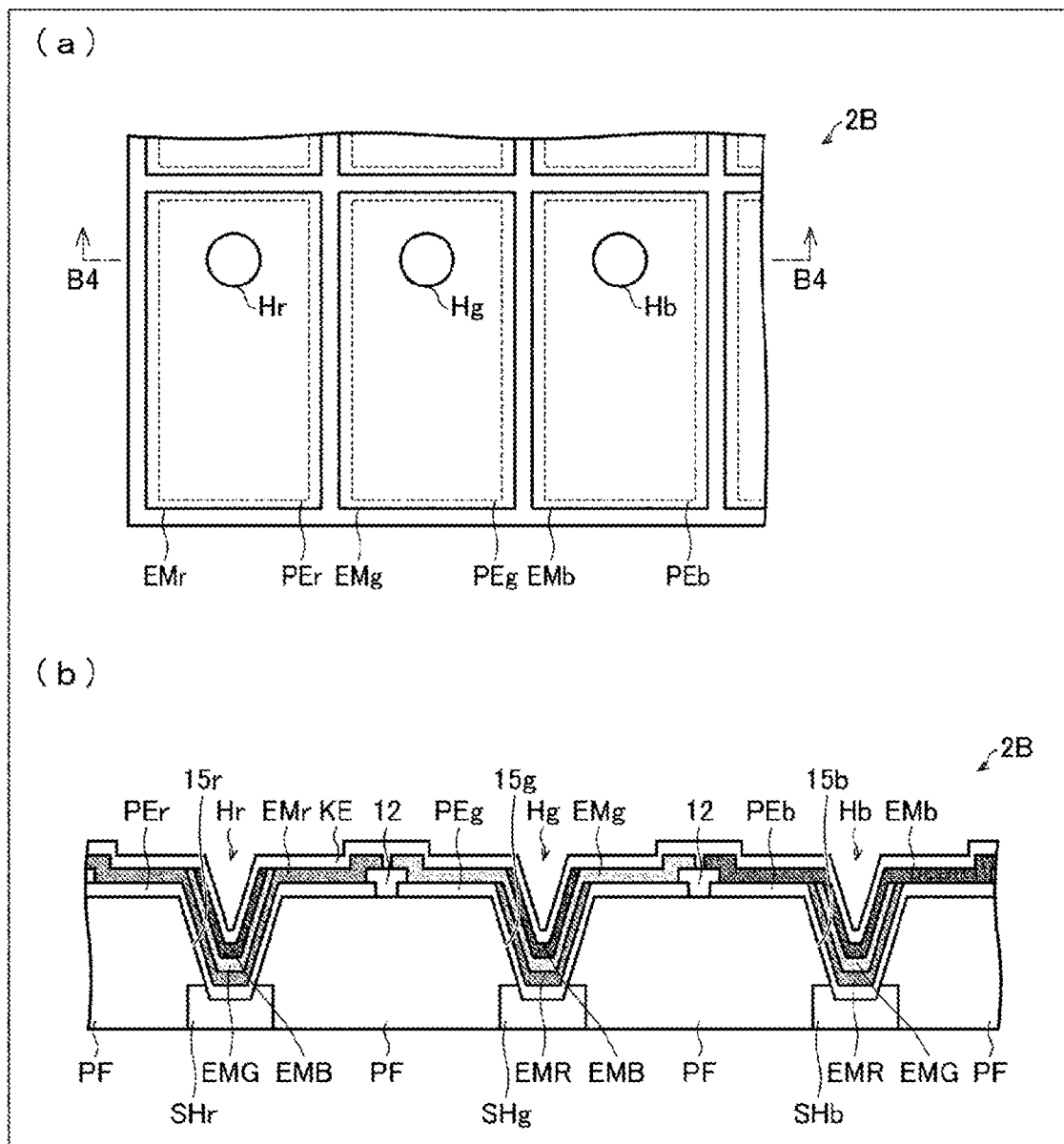
FIG. 13(a) is a plan view of another display device according to Example 3.
FIG. 13(b) is a cross-sectional view along a plane B4-B4 illustrated in FIG. 13(a).

FIG. 13(a) is a plan view of a display device 2B according Example 3, and FIG. 13(b) is a cross-sectional view along a plane B4-B4 illustrated in FIG. 13(a). Constituent elements similar to the constituent elements described above are given the same reference numerals, and detailed descriptions thereof are not repeated.

The contact holes Hr, Hg, and Hb having the inclined faces 15r, 15g, and 15b are formed in the organic insulating film PF as illustrated in FIGS. 13(a) and 13(b). Then, the pixel electrode PEr is formed along the inclined face 15r of the contact hole Hr and the surface of the organic insulating film PF as illustrated in FIGS. 13(a) and 13(b). The intra-pixel wiring line SHr is connected to the pixel electrode PEr within the contact hole Hr. The red light-emitting layer EMr is formed on the organic insulating film PF to cover the pixel electrode PEr as illustrated in FIGS. 13(a) and 13(b).

Then, the green light-emitting layer EMG and the blue light-emitting layer EMB are formed in this order in an upper layer than the light-emitting layer EMr to overlap the red light-emitting layer EMr at least in the inclined face 15r of the contact hole Hr.

The pixel electrode PEg is formed along the inclined face 15g of the contact hole Hg and the surface of the organic insulating film PF as illustrated in FIGS. 13(a) and 13(b). The intra-pixel wiring line SHg is connected to the pixel electrode PEg within the contact hole Hg. The green light-emitting layer EMg is formed on the organic insulating film PF to cover the pixel electrode PEg as illustrated in FIGS. 13(a) and 13(b).

Then, the red light-emitting layer EMR and the blue light-emitting layer EMB are formed to overlap the green light-emitting layer EMg at least in the inclined face 15g of the contact hole Hg. The red light-emitting layer EMR is formed in a lower layer than the green light-emitting layer EMg, and the blue light-emitting layer EMB is formed in an upper layer than the green light-emitting layer EMg.

The pixel electrode PEb is formed along the inclined face 15b of the contact hole Hb and the surface of the organic insulating film PF as illustrated in FIGS. 13(a) and 13(b). The intra-pixel wiring line SHb is connected to the pixel electrode PEb within the contact hole Hb. The blue light-emitting layer EMb is formed on the organic insulating film PF to cover the pixel electrode PEb as illustrated in FIGS. 13(a) and 13(b).

Then, the red light-emitting layer EMR and the green light-emitting layer EMG are formed to overlap the blue light-emitting layer EMb at least in the inclined face 15b of the contact hole Hb. The red light-emitting layer EMR is formed in a lower layer than the green light-emitting layer EMG, and the blue light-emitting layer EMb is formed in an upper layer than the green light-emitting layer EMG.

An inter-pixel insulating layer 12 is formed between the pixel electrode PEr and the pixel electrode PEg, and between the light-emitting layer EMr and the light-emitting layer EMg. This inter-pixel insulating layer 12 is also formed between the pixel electrode PEg and the pixel electrode PEb, and between the light-emitting layer EMg and the light-emitting layer EMb.

In this manner, the light-emitting layers are layered in the order of red, green, and blue within any of the contact holes Hr, Hg, and Hb. In other words, the emission wavelength of the light-emitting layer changes in the order of the red light-emitting layer, the green light-emitting layer, and the blue light-emitting layer from the lower layer toward the upper layer in any of the contact holes Hr, Hg, and Hb.

In the center portion of the contact holes Hr, Hg, and Hb, the thickness of the light-emitting layer formed in the lowest layer is the thickest, and the thickness becomes thinner toward the upper layer.

A height between the surface of the light-emitting layer EMr on the organic insulating film PF and the surface of the light-emitting layer EMr at the bottom of the contact hole Hr is smaller than a height between the surface of the pixel electrode PEr on the organic insulating film PF and the surface of the pixel electrode PEr at the bottom of the contact hole Hr. This is because the pixel electrode PEr is formed by vapor deposition or sputtering, and the light-emitting layer EMr is formed by a method based on application. The reason is that the film formed by the application has a film thickness thicker in the recessed portion. The same applies to the pixel electrode PEg and the light-emitting layer EMg, and the pixel electrode PEb and the light-emitting layer EMb.

The emission wavelength of the light-emitting layer closer to the pixel electrode at the lowermost portion of each of the contact holes Hr, Hg, and Hb is the longest, and the emission wavelength of the light-emitting layer closer to the common electrode is the shortest. For example, at the lowermost portion of the contact hole Hr, the light-emitting layer EMr has the emission wavelength longer than the light-emitting layer EMG, and the light-emitting layer EMB has the emission wavelength shorter than the light-emitting layer EMG. Similarly, at the lowermost portion of the contact hole Hg, the light-emitting layer EMR has the emission wavelength longer than the light-emitting layer EMg, and the light-emitting layer EMB has the emission wavelength shorter than the light-emitting layer EMg. At the lowermost portion of the contact hole Hb, the light-emitting layer EMR has the emission wavelength longer than the light-emitting layer EMG, and the light-emitting layer EMb has the emission wavelength shorter than the light-emitting layer EMG.

In this manner, in a case where the red layer is disposed in the lowest layer at the lowest portion of each of the contact holes Hr, Hg, and Hb, the red layer is easily formed to be the thickest. The light-emitting layer may absorb an external light having a wavelength shorter than the emission wavelength. As a result, the red light-emitting layer capable of absorbing the external light having the widest wavelength range is the thickest, and unnecessary external light reflection in or near the contact holes Hr, Hg, and Hb can be suppressed.

The edge of the light-emitting layer is formed outside the edge of the pixel electrode. Specifically, the edge of light-emitting layer EMr is formed outside the edge of the pixel electrode PEr, the edge of the light-emitting layer EMg is formed outside the edge of the pixel electrode PEg, and the edge of the light-emitting layer EMb is formed outside the edge of the pixel electrode PEb. This allows to the pixel electrode PEb including the edge be used, and thus, the light emission area of each light-emitting layer can be widened.

However, in order to suppress leakage current between adjacent pixel electrodes, as illustrated in FIG. 13(b), the inter-pixel insulating layer 12 having a thickness of 500 nm or less, which is thinner than the organic insulating film PF, may be formed in contact with adjacent pixel electrodes to cover edges of the adjacent pixel electrodes.

Figure 14:
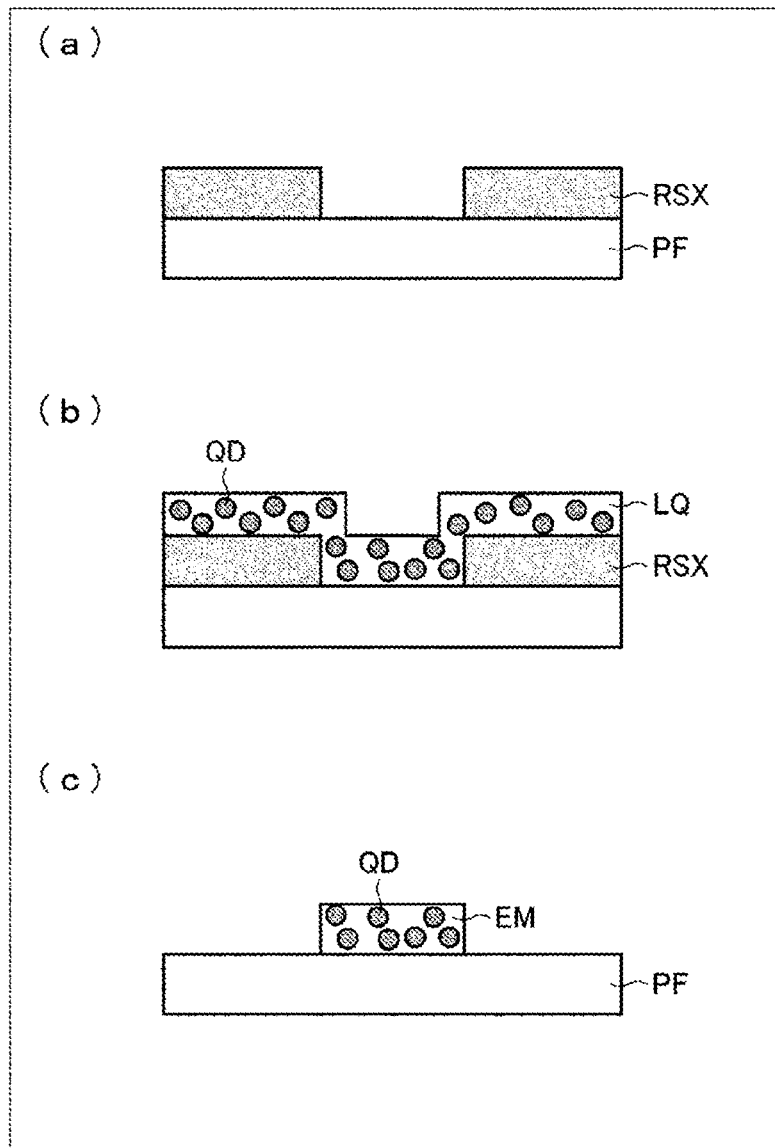
FIGS. 14(a) to 14(c) are schematic cross-sectional views illustrating another process for patterning the EL layer.

FIGS. 14(a) to 14(c) are schematic cross-sectional views illustrating another process for patterning the EL layer 8. The light-emitting layers EMb, EMg, and EMr may be pattern formed, in addition to by the patterning method using the photosensitive resin described above in FIG. 5, by a lift-off method described below.

First, a positive-working resist RSX is applied onto the organic insulating film PF by slit coating, ink-jet, spin coating, gravure printing, or the like (application thickness is, for example, 20 to 500 nm). Next, the applied resist RSX is prebaked at 80 to 120° C. in a hot plate or an oven to evaporate a solvent and dry a coating film. Next, the dried resist RSX is subjected to UV exposure over a mask (exposure intensity is, for example, 10 to 1000 [mJ/cm2]). Next, as illustrated in FIG. 14(a), the resultant is developed using an alkali solution, organic solvent, water, or the like.

Then, as illustrated in FIG. 14(b), a quantum dot solution LQ including quantum dots QD is applied by slit coating, ink-jet, spin coating, atomization coating, gravure printing, or the like (application thickness is, for example, 20 to 100 nm). Next, the applied quantum dot solution LQ is dried at 80 to 120° C. in a hot plate or an oven to evaporate a solvent and dry a coating film. After that, the quantum dot solution LQ layered on the resist RSX is peeled off together with the resist RSX using an alkali solution, organic solvent, water, or the like, to obtain a pattern formed light-emitting layer EM. The formed light-emitting layer EM contains quantum dots and ligands.

FIGS. 15(a) to 15(e) are correspondence diagrams of cross-sectional and plan views illustrating a process for forming the EL layer and the common electrode layer in Example 3.

A light-emitting layer of a certain color pixel and a light-emitting layer covering contact holes in other color pixels are formed simultaneously. For example, the light-emitting layer EMr of the red pixel and the light-emitting layer EMR covering the contact holes Hg and Hb in the green and blue pixels are formed simultaneously. The light-emitting layer EMg of the green pixel and the light-emitting layer EMG covering the contact holes Hb and Hr in the blue and red pixels are formed simultaneously. Similarly, the light-emitting layer EMb of the blue pixel and the light-emitting layer EMB covering the contact holes Hr and Hg in the red and green pixels are formed simultaneously.

First, the pixel electrodes PEr, PEg, and PEb are formed on the organic insulating layer PF in which the contact holes Hr, Hg, and Hb are formed, as illustrated in FIG. 15(a). Then, as illustrated in FIG. 15(b), the red light-emitting layer EMr overlapping the entire pixel electrode PEr, and the light-emitting layer EMR covering the contact hole Hg in the green pixel and the contact hole Hb in the blue pixel are simultaneously pattern formed. Next, as illustrated in FIG. 15(c), the green light-emitting layer EMg overlapping the entire pixel electrode PEg, and the light-emitting layer EMG covering the contact hole Hb in the blue pixel and the contact hole Hr in the red pixel are simultaneously pattern formed. After that, as illustrated in FIG. 15(d), the blue light-emitting layer EMb overlapping the entire pixel electrode PEb, and the light-emitting layer EMB covering the contact hole Hr in the red pixel and the contact hole Hg in the green pixel are simultaneously pattern formed.

Next, as illustrated in FIG. 15(e), the common electrode KE covering the light-emitting layers EMb, EMg, and EMr is formed.

According to this forming process, it is not necessary to form, separately from a light-emitting layer of a certain color pixel, a light-emitting layer only in contact holes in other color pixels, and thus, the manufacturing process is simplified.

The light-emitting layers of different colors are formed to overlap one on top of another within each of the contact holes. For example, in the example illustrated in FIG. 15, the light-emitting layer EMr, the light-emitting layer EMG, and the light-emitting layer EMB are formed to overlap one on top of another in this order within the contact hole Hr. The light-emitting layer EMR, the light-emitting layer EMg, and the light-emitting layer EMB are formed to overlap one on top of another in this order within the contact hole Hg. The light-emitting layer EMR, the light-emitting layer EMG, and the light-emitting layer EMb are formed to overlap one on top of another in this order within the contact hole Hb.

The light-emitting layers of different colors may be formed to overlap on top or another not only within the contact holes but also between the pixel electrodes. In this case, the order of layering the light-emitting layers of the respective colors in the contact hole is the same as the order of layering the light-emitting layers of the respective colors between the pixel electrodes. However, another light-emitting layer may be interposed between the light-emitting layers. An example is shown below (Table 1).

In any of Examples 1 to 4 below (in Table 1), the layering order is common in that the green light-emitting layer is layered in an upper layer than the red light-emitting layer, and the blue light-emitting layer is layered in an upper layer than the green light-emitting layer or the red light-emitting layer.

TABLE 1

| | Layering order in contact hole | Layering order between pixels |
|---|---|---|
| Example 1 | Common electrode<br>Blue light-emitting layer<br>Green light-emitting layer<br>Red light-emitting layer<br>Pixel electrode | Common electrode<br>Blue light-emitting layer<br>Green light-emitting layer<br>Red light-emitting layer |
| Example 2 | Common electrode<br>Blue light-emitting layer<br>Green light-emitting layer<br>Red light-emitting layer<br>Pixel electrode | Common electrode<br>Blue light-emitting layer<br>Red light-emitting layer |
| Example 3 | Common electrode<br>Green light-emitting layer<br>Red light-emitting layer<br>Pixel electrode | Common electrode<br>Blue light-emitting layer<br>Green light-emitting layer<br>Red light-emitting layer |
| Example 4 | Common electrode<br>Blue light-emitting layer<br>Green light-emitting layer<br>Red light-emitting layer<br>Pixel electrode | Common electrode<br>Blue light-emitting layer<br>Green light-emitting layer<br>Red light-emitting layer<br>Inter-pixel insulating layer |

FIGS. 16(a) and 16(b) are correspondence diagrams of cross-sectional and plan views illustrating a configuration near the contact hole of the display device according to Example 3.

The light-emitting layer EMr is formed within the contact hole Hr and above the organic insulating layer PF via the pixel electrode PEr. The light-emitting layer EMB is formed within the contact hole Hr via the pixel electrode PEr.

FIG. 16(a) corresponds to an enlarged view of the main portion of FIG. 12(a) described above. A maximum film thickness $2b$ of the light-emitting layer EMB within the contact hole Hr is smaller than a maximum film thickness $1b$ of the light-emitting layer EMr within the contact hole Hr. In other words, $2b<1b$.

An average film thickness $1t$ of the light-emitting layer EMr on the organic insulating layer PF is smaller than the maximum film thickness $1b$ of the light-emitting layer EMr within the contact hole Hr. An average film thickness $2t$ of the light-emitting layer EMB on the organic insulating layer PF is smaller than the maximum film thickness $2b$ of the light-emitting layer EMB within the contact hole Hr. In other words, $1t<1b$ and $2t<2b$. This suppresses the electric field concentration to the bottom of the contact hole Hr.

An average interval e1 between the pixel electrode PEr and the common electrode KE on the organic insulating film PF is smaller than a minimum interval e2 between the pixel electrode PEr and the common electrode KE at a location where the film thickness of the light-emitting layer EMr is thinnest in the inclined face 15r of the contact hole Hr. The minimum interval e2 is smaller than a sum of the average film thickness 1t and the average film thickness 2t described above. Furthermore, the sum of the average film thickness 1t and the average film thickness 2t is smaller than a sum of the maximum film thickness 1b and the maximum film thickness 2b described above. In other words, e1<e2<2t+1t<1b+2b. This suppresses the electric field concentration to the edge of the contact hole Hr.

A height difference D of the common electrode KE within the contact hole Hr is smaller than a thickness L of the organic insulating layer PF from a position where the pixel electrode PEr contacts the intra-pixel wiring line SHr to a top of the organic insulating layer PF. In other words, D<L. This prevents a step breakage of the common electrode KE at a step of the contact hole Hr.

An outermost edge portion c1 surrounded by an outermost edge of a region where the pixel electrode PEr contacts the intra-pixel wiring line SHr is included in an outermost edge portion c2 surrounded by an outermost edge of a region where the thickness of the organic insulating layer PF changes in or near the contact hole Hr. The outermost edge portion c2 is included in an outermost edge portion c3 surrounded by an outermost edge of a region where the thickness of the light-emitting layer EMr changes in or near the contact hole Hr. The outermost edge portion c3 is included in an outermost edge portion c4 surrounded by an outermost edge of a region where the plurality of light-emitting layers (light-emitting layer EMr and light-emitting layer EMB) overlap. An inner side of the outermost edge portion c4 serves as a multilayer region where the plurality of light-emitting layers (for example, the light-emitting layer EMr and the light-emitting layer EMB) overlap, and an outer side of the outermost edge portion c4 serves as a single layer region where only one light-emitting layer (for example, the light-emitting layer EMr) is formed.

The following relationship is satisfied.

$$30° \leq \arctan(L/(C2-C1)) < 60°$$

where C1 and C2 refer to distances from the center of the smallest circle containing the region where the intra-pixel wiring line SHr contacts the pixel electrode PEr to the outermost edge portion c1 and the outermost edge portion c2 in the same direction, respectively.

In a case where arctan (L/(C2−C1)) is less than 30°, a flat portion of the bottom of the contact hole Hr of the pixel electrode PEr is reduced, and thus, the light emission area becomes narrower. In a case where the arctan (L/(C2−C1)) is 60° or more, the pixel electrode PEr is difficult to form, and step breakage at the step of the contact hole Hr tends to occur.

FIGS. 17(a) and 17(b) are correspondence diagrams of cross-sectional and plan views illustrating another configuration near the contact hole of the display device according to Example 3.

In the example described above in FIG. 16, the red light-emitting layer (light-emitting layer EMr) is formed on the bottom of the contact hole Hr closer to the pixel electrode PEr, and the blue light-emitting layer (light-emitting layer EMB) is formed closer to the common electrode KE. In contrast, in the example illustrated in FIG. 17, the blue light-emitting layer (light-emitting layer EMB) is formed on the bottom of the contact hole Hr closer to the pixel electrode PEr. The red light-emitting layer (light-emitting layer EMr) is formed closer to the common electrode KE.

The blue light-emitting layer has the shortest emission wavelength in the red, green, and blue light-emitting layers. The red light-emitting layer has the longest emission wavelength in the above light-emitting layers.

In a case where the light-emitting layer having a long emission wavelength is disposed in an upper layer (the viewer side of the display device), the light-emitting layer absorbs wavelengths shorter than the emission wavelength, so it is possible to reduce an amount of external light reaching the lower layer. A light emitted by external light absorption in the light-emitting layer in the lowest layer having a short light emission wavelength can be absorbed by the light-emitting layer in the upper layer having a long emission wavelength, so it is possible to suppress PL emission due to the external light absorption in or near the contact holes, and viewability is improved. For example, as illustrated in FIG. 17(b), in a case where the red light-emitting layer EMr is formed in an upper layer and the blue light-emitting layer EMB is formed in a lower layer, a light of an external light A 1 having a wavelength shorter than the red color is absorbed by the light-emitting layer EMr. A light having a wavelength shorter than the red light emitted by the light-emitting layer EMB in the lower layer is absorbed by the light-emitting layer EMr in the upper layer.

FIGS. 18(a) to 18(e) are correspondence diagrams of cross-sectional and plan views illustrating another process for forming the EL layer and the common electrode layer in Example 3. FIGS. 19(a) to 19(e) are cross-sectional views illustrating the above described another process for forming.

Difference from the forming process described above in FIG. 15 is that the blue light-emitting layer is first formed, then the green light-emitting layer is formed, and the red light-emitting layer is finally formed. In this case also, a light-emitting layer of a certain color pixel and a light-emitting layer covering contact holes in other color pixels are formed simultaneously.

Figure 18:
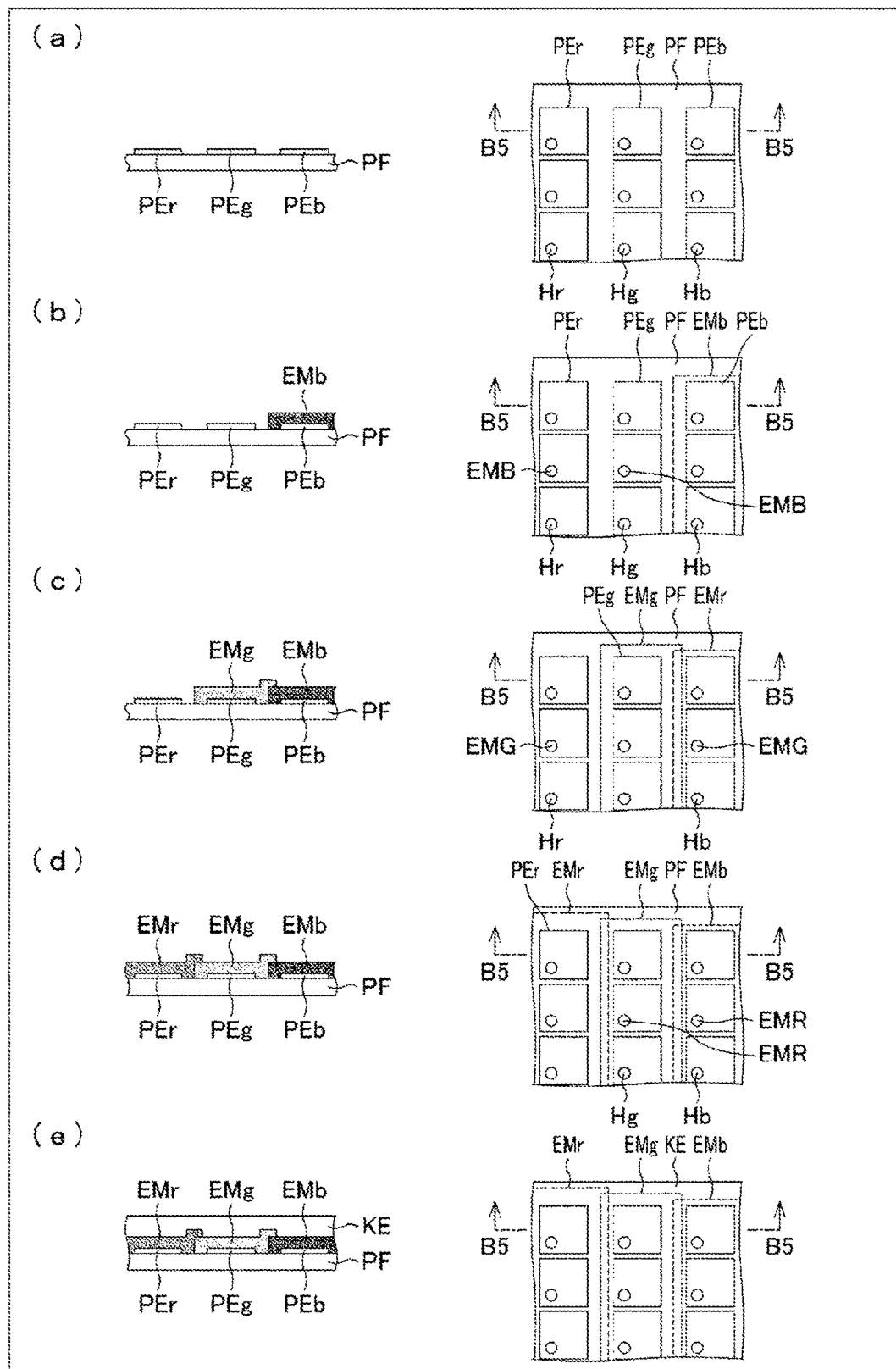
FIGS. 18(a) to 18(e) are correspondence diagrams of cross-sectional and plan views illustrating another process for forming the EL layer and the common electrode layer in Example 3.
Figure 19:
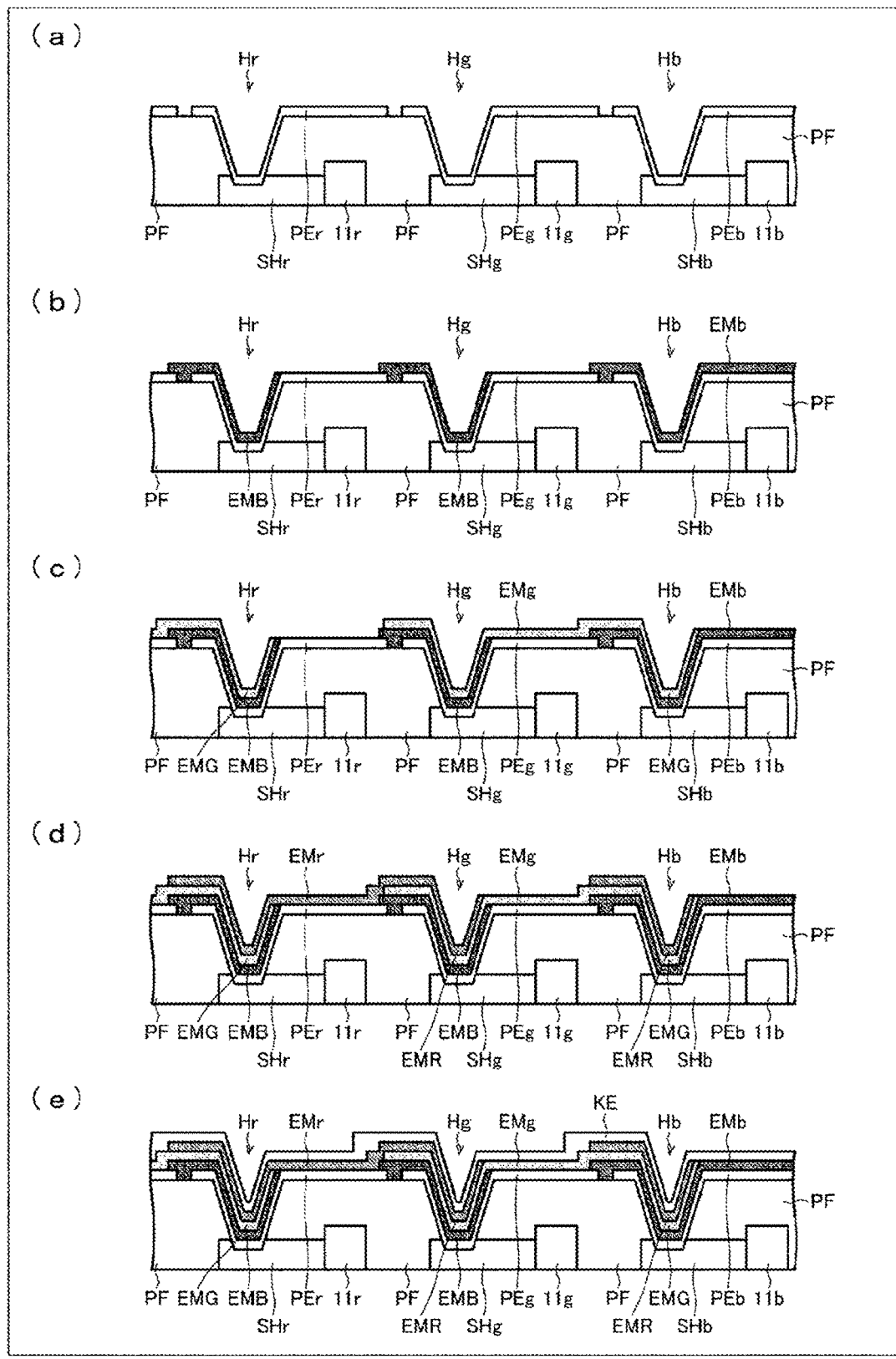
FIGS. 19(a) to 19(e) are cross-sectional views illustrating the above described another process for forming.

First, the pixel electrode PEr (third pixel electrode), the pixel electrode PEg (second pixel electrode), and the pixel electrode PEb (first pixel electrode) are formed on the organic insulating layer PF in which the contact hole Hr, the contact hole Hg (second contact hole), and the contact hole Hb (first contact hole) are formed, as illustrated in FIGS. 18(a) and 19(a). Then, as illustrated in FIG. 18(b) and FIG. 19(b), the blue light-emitting layer EMb (first light-emitting layer) overlapping the entire pixel electrode PEb, and the light-emitting layer EMB covering the contact hole Hr in the red pixel and the contact hole Hg in the green pixel are simultaneously pattern formed. Next, as illustrated in FIG. 18(c) and FIG. 19(c), the green light-emitting layer EMg (second light-emitting layer) overlapping the entire pixel electrode PEg, and the light-emitting layer EMG (second light-emitting layer) covering the contact hole Hb in the blue pixel and the contact hole Hr in the red pixel are simultaneously pattern formed. After that, as illustrated in FIG. 18(d) and FIG. 19(d), the red light-emitting layer EMr overlapping the entire pixel electrode PEr, and the light-emitting layer EMR (third light-emitting layer) covering the contact hole Hb in the blue pixel and the contact hole Hg in the green pixel are simultaneously pattern formed.

Next, as illustrated in FIG. 18(e) and FIG. 19(e), the common electrode KE covering the light-emitting layers EMb, EMg, and EMr is formed.

According to this forming process, it is not necessary to form, separately from a light-emitting layer of a certain color pixel, a light-emitting layer covering only contact holes in other color pixels, and thus, the manufacturing process is simplified.

Figure 15:
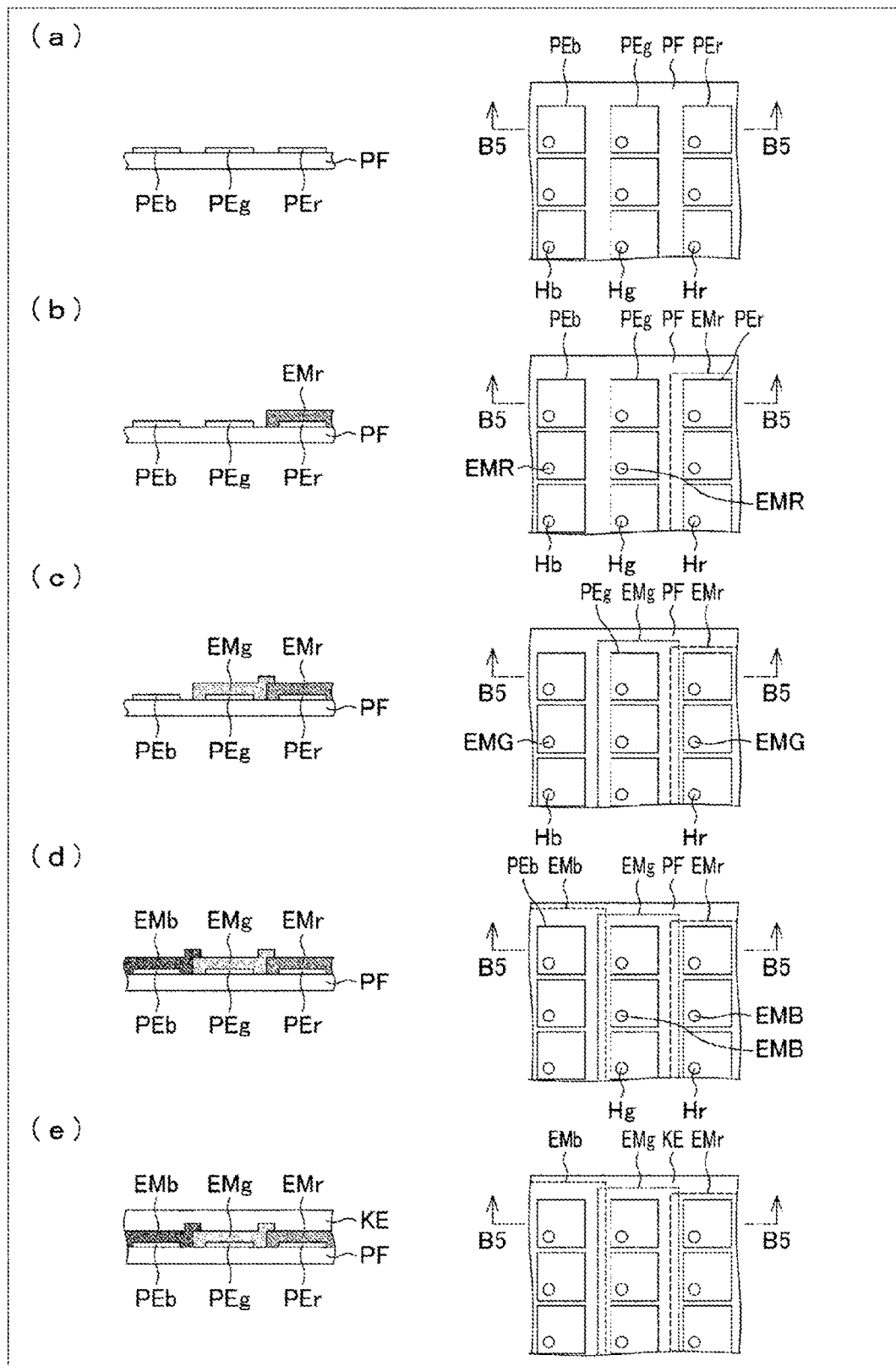
FIGS. 15(a) to 15(e) are correspondence diagrams of cross-sectional and plan views illustrating a process for forming an EL layer and a common electrode layer in Example 3.

Similar to the forming process descried above in FIG. 15, the order of layering the light-emitting layers of the respective colors in the contact hole is the same as the order of layering the light-emitting layers of the respective colors between the pixel electrodes. An example is shown below (Table 2).

In any of Examples 1 to 4 below (in Table 2), the layering order is common in that the green light-emitting layer is layered in an upper layer than the blue light-emitting layer, and the red light-emitting layer is layered in an upper layer than the green light-emitting layer or the blue light-emitting layer.

TABLE 2

| | Layering order in contact hole | Layering order between pixels |
|---|---|---|
| Example 1 | Common electrode<br>Red light-emitting layer<br>Green light-emitting layer<br>Blue light-emitting layer<br>Pixel electrode | Common electrode<br>Red light-emitting layer<br>Green light-emitting layer<br>Blue light-emitting layer |
| Example 2 | Common electrode<br>Red light-emitting layer<br>Green light-emitting layer<br>Blue light-emitting layer<br>Pixel electrode | Common electrode<br>Red light-emitting layer<br><br>Blue light-emitting layer |
| Example 3 | Common electrode<br>Green light-emitting layer<br>Blue light-emitting layer<br>Pixel electrode | Common electrode<br>Red light-emitting layer<br>Green light-emitting layer<br>Blue light-emitting layer |
| Example 4 | Common electrode<br>Red light-emitting layer<br>Green light-emitting layer<br>Blue light-emitting layer<br>Pixel electrode | Common electrode<br>Red light-emitting layer<br>Green light-emitting layer<br>Blue light-emitting layer<br>Inter-pixel insulating layer |

Figure 20:
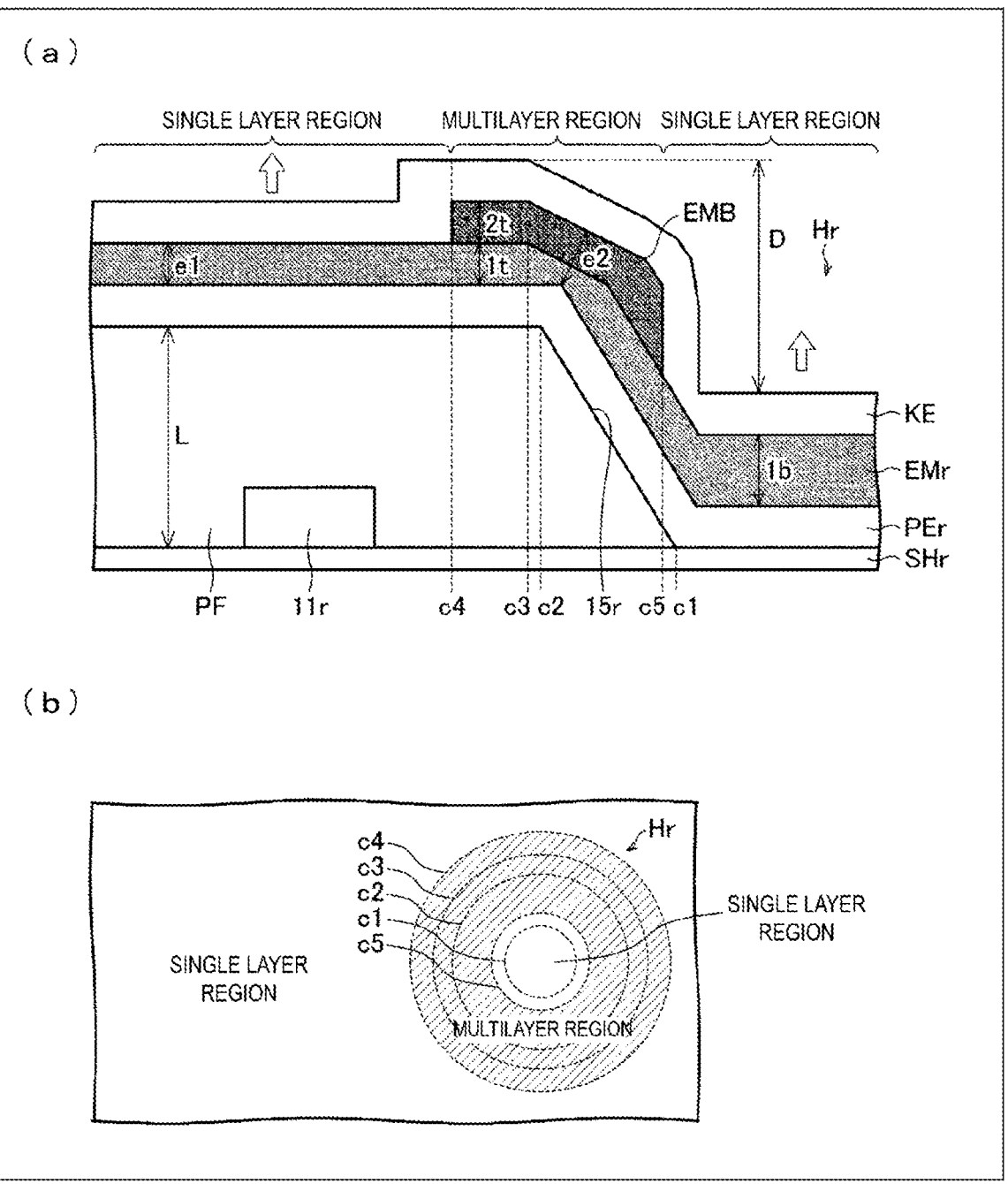
FIGS. 20(a) and 20(b) are correspondence diagrams of cross-sectional and plan views illustrating further another configuration near the contact hole of the display device according to Example 3.

FIGS. 20(a) and 20(b) are correspondence diagrams of cross-sectional and plan views illustrating further another configuration near the contact hole of the display device according to Example 3.

Figure 16:
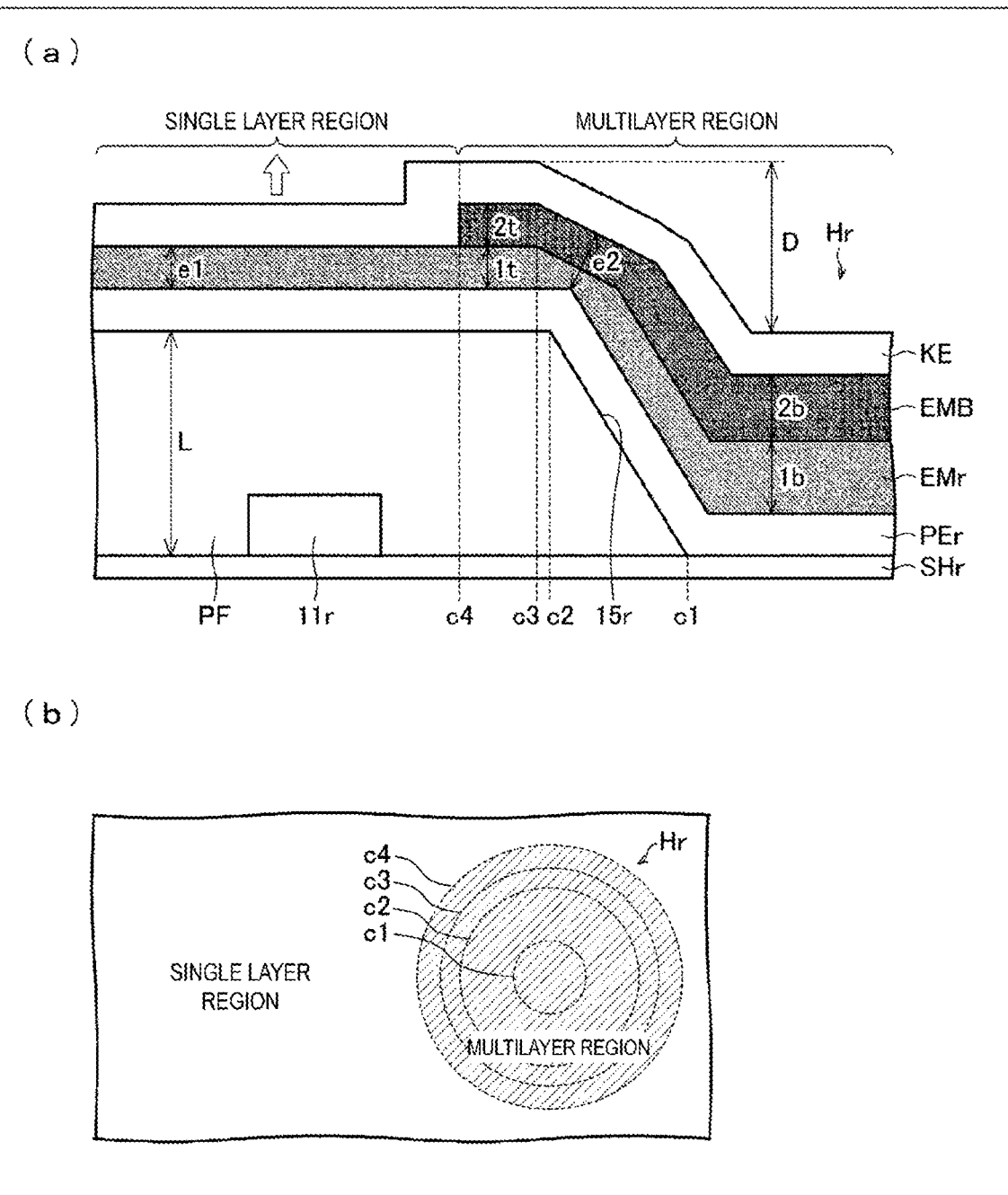
FIGS. 16(a) and 16(b) are correspondence diagrams of cross-sectional and plan views illustrating a configuration near a contact hole of the display device according to Example 3.
Figure 17:
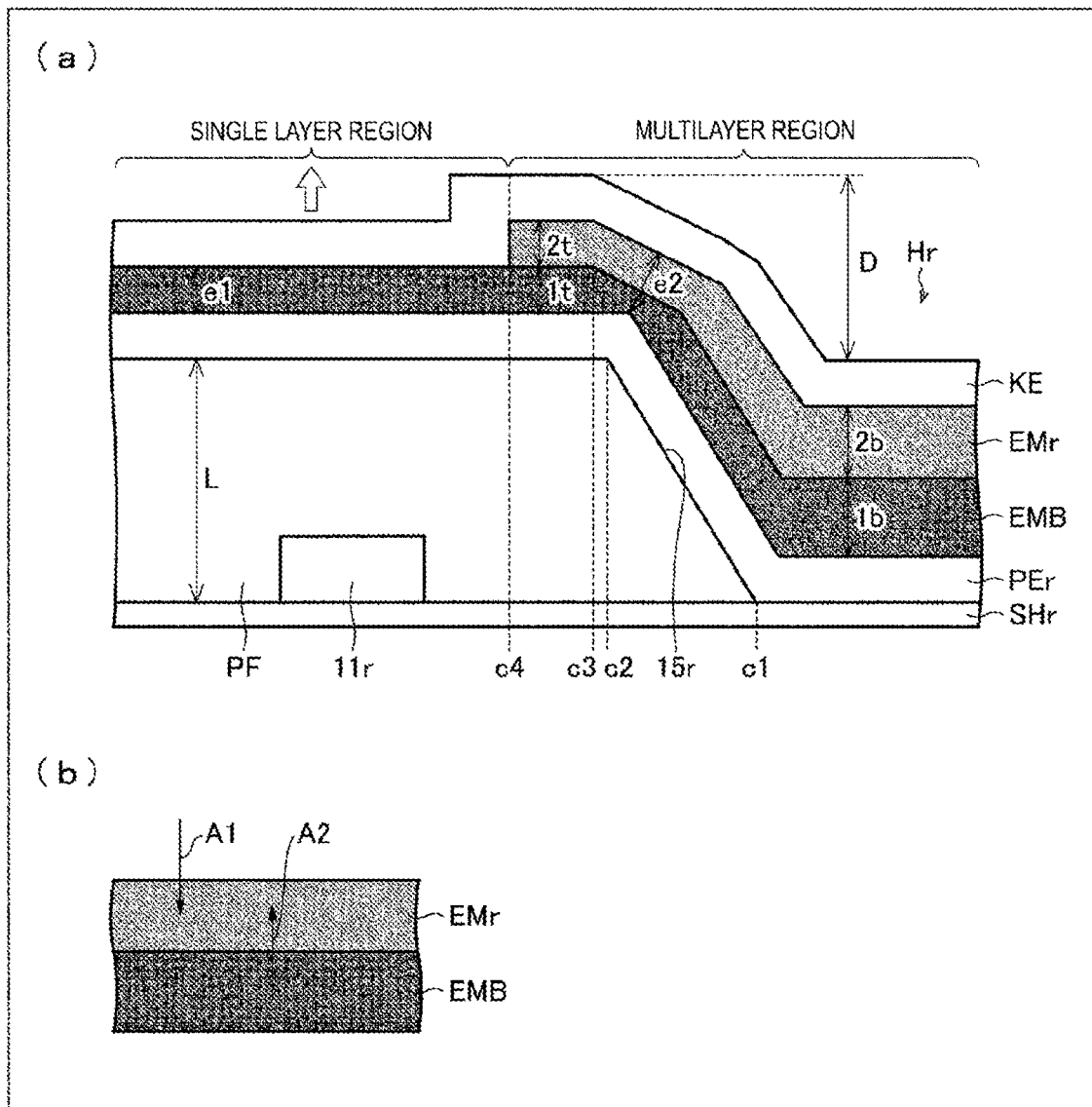
FIGS. 17(a) and 17(b) are correspondence diagrams of cross-sectional and plan views illustrating another configuration near the contact hole of the display device according to Example 3.

Difference from the above-described FIGS. 16 and 17 is that only one type of light-emitting layer EMr is formed on the bottom of the contact hole Hr between the pixel electrode PEr and the common electrode KE, and a plurality of types of light-emitting layers EMr and EMB are formed in the inclined face 15r of the contact hole Hr between the pixel electrode PEr and the common electrode KE.

In this configuration, since the light-emitting layer is a single layer around the bottom of the contact hole Hr, light emission is enabled by applying a high voltage, and therefore, the light emission area of the light-emitting layer EMr is widened, allowing the luminance of the display device to be increased.

The outermost edge portion c1 surrounded by the outermost edge of the region where the pixel electrode PEr contacts the intra-pixel wiring line SHr is included in an innermost edge portion c5 surrounded by an innermost edge of a region where the plurality of types of light-emitting layers EMr and EMB overlap. The innermost edge portion c5 is included in the outermost edge portion c2 surrounded by an outermost edge of a region where the thickness of the organic insulating layer PF changes in or near the contact hole Hr. The outermost edge portion c2 is included in the outermost edge portion c3 surrounded by the outermost edge of the region where the thickness of the light-emitting layer EMr changes in or near the contact hole Hr. The outermost edge portion c3 is included in the outermost edge portion c4 surrounded by the outermost edge of the region where the plurality of light-emitting layers (light-emitting layer EMr and light-emitting layer EMB) overlap.

The average interval e1 between the pixel electrode PEr and the common electrode KE on the organic insulating film PF is or less than the maximum film thickness $1b$ of the light-emitting layer EMr within the contact hole Hr. The maximum film thickness $1b$ is smaller than the minimum interval e2 between the pixel electrode PEr and the common electrode KE at a location where the film thickness of the light-emitting layer EMr is thinnest in the inclined face 15r of the contact hole Hr. The minimum interval e2 is smaller than a sum of the average film thickness $1t$ of the light-emitting layer EMr on the organic insulating layer PF and the average film thickness $2t$ of the light-emitting layer EMB on the organic insulating layer PF. In other words, $e1 \leq 1b < e2 < 1t + 2t$.

Figure 21:
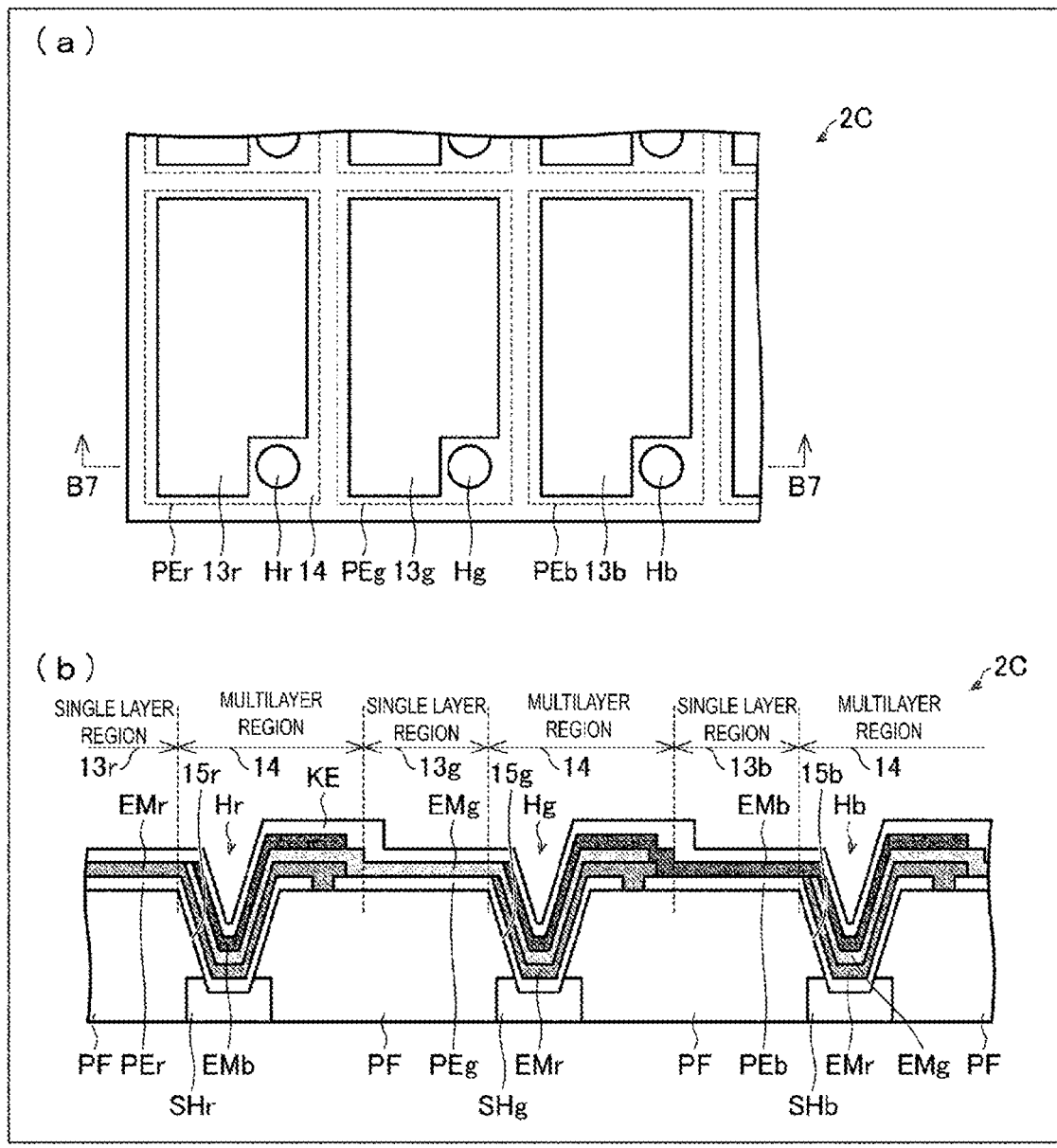
FIG. 21(a) is a plan view of further another display device according Example 3.
FIG. 21(b) is a cross-sectional view along a plane B7-B7 illustrated in FIG. 21(a).

FIG. 21(a) is a plan view of further another display device 2C according Example 3, and FIG. 21(b) is a cross-sectional view along a plane B7-B7 illustrated in FIG. 21(a). Constituent elements similar to the constituent elements described above are given the same reference numerals, and detailed descriptions thereof are not repeated.

The contact holes Hr, Hg, and Hb having the inclined faces 15r, 15g, and 15b are formed in the organic insulating film PF as illustrated in FIGS. 21(a) and 21(b). Then, the pixel electrode PEr is formed along the inclined face 15r of the contact hole Hr and the surface of the organic insulating film PF as illustrated in FIGS. 21(a) and 21(b). The intra-pixel wiring line SHr is electrically connected to the pixel electrode PEr within the contact hole Hr. The pixel electrode PEg is formed along the inclined face 15g of the contact hole Hg and the surface of the organic insulating film PF as illustrated in FIGS. 21(a) and 21(b). The intra-pixel wiring line SHg is electrically connected to the pixel electrode PEg within the contact hole Hg. The pixel electrode PEb is formed along the inclined face 15b of the contact hole Hb and the surface of the organic insulating film PF as illustrated in FIGS. 21(a) and 21(b). The intra-pixel wiring line SHb is electrically connected to the pixel electrode PEb within the contact hole Hb.

Then, the red light-emitting layer EMr is formed on the organic insulating film PF to cover the pixel electrode PEr, the peripheral edge portion of the pixel electrode PEg, the contact hole Hg, the peripheral edge portion of the pixel electrode PEb, and the contact hole Hb as illustrated in FIGS. 21(a) and 21(b). The green light-emitting layer EMg is formed on the organic insulating film PF to cover the pixel electrode PEg, the peripheral edge portion of the pixel electrode PEr, the contact hole Hr, the peripheral edge portion of the pixel electrode PEb, and the contact hole Hb as illustrated in FIGS. 21(a) and 21(b). Furthermore, the blue light-emitting layer EMb is formed on the organic insulating film PF to cover the pixel electrode PEb, the peripheral edge portion of the pixel electrode PEr, the contact hole Hr, the peripheral edge portion of the pixel electrode PEg, and the contact hole Hg as illustrated in FIGS. 21(a) and 21(b).

Only one layer of the light-emitting layer EMr is formed in a single layer region 13r. Only one layer of the light-emitting layer EMg is formed in a single layer region 13g, and only one layer of the light-emitting layer EMb is formed in a single layer region 13b. Then, in a three-layer region 14 that is a region other than the single layer regions 13r, 13g, and 13b, three light-emitting layers EMr, EMg, and EMb are formed to overlap on top of another.

A red light is emitted from the light-emitting layer EMr in the single layer region 13r, a green light is emitted from the light-emitting layer EMg in the single layer region 13g, and a blue light is emitted from the light-emitting layer EMb in the single layer region 13b.

In this manner, the three-layer region 14 in which the light-emitting layers are multilayered is disposed to seamlessly cover the contact holes Hr, Hg, Hb, the peripheral edge portion of each pixel electrodes PEr, the peripheral edge portion of each pixel electrode PEg, and the peripheral edge portion of each pixel electrode PEb. In this configuration, the plurality of light-emitting layers are layered in a region prone to degradation due to the electric field concentration, thereby mitigating the electric field concentration and suppressing the degradation of the light-emitting element.

In Example 3, at least two of the light-emitting layers EMr, EMg, and EMb may overlap at least in the inclined faces 15r, 15g, and 15b of the contact holes Hr, Hg, and Hb, and the edge cover (an insulating film covering the edge of the pixel electrode) may or may not be present. In a case where the edge cover is present, it is possible to further mitigate the electric field concentration at the pixel edge, which makes it possible to further suppress the degradation of the light-emitting element. The same applies to Example 4 described later.

Example 4

FIG. 22(a) is a cross-sectional view of a display device 2D according to Example 4, and FIG. 22(b) is a plan view illustrating a modification example of Example 4. Constituent elements similar to the constituent elements described above are given the same reference numerals, and detailed descriptions thereof are not repeated.

As illustrated in FIG. 22(a), the pixel electrode PEr includes a branch electrode Exr protruding toward the adjacent pixel electrode PEg. The contact hole Hr is formed at a position corresponding to the branch electrode Exr. The pixel electrode PEg includes a branch electrode Exg protruding toward the pixel electrode PEr to face the branch electrode Exr. The contact hole Hg is formed at a position corresponding to the branch electrode Exg.

The pixel electrode PEb is disposed opposite to the pixel electrode PEr with respect to the pixel electrode PEg. Another pixel electrode PEr is disposed opposite to the pixel electrode PEg with respect to the pixel electrode PEb.

The pixel electrode PEb includes a branch electrode Exb protruding toward the adjacent other pixel electrode PEr. The contact hole Hb is formed at a position corresponding to the branch electrode Exb. The other pixel electrode PEr includes another branch electrode Exr protruding toward the pixel electrode PEb to face the branch electrode Exb. Another contact hole Hr is formed at a position corresponding to such another branch electrode Exr.

Figure 22:
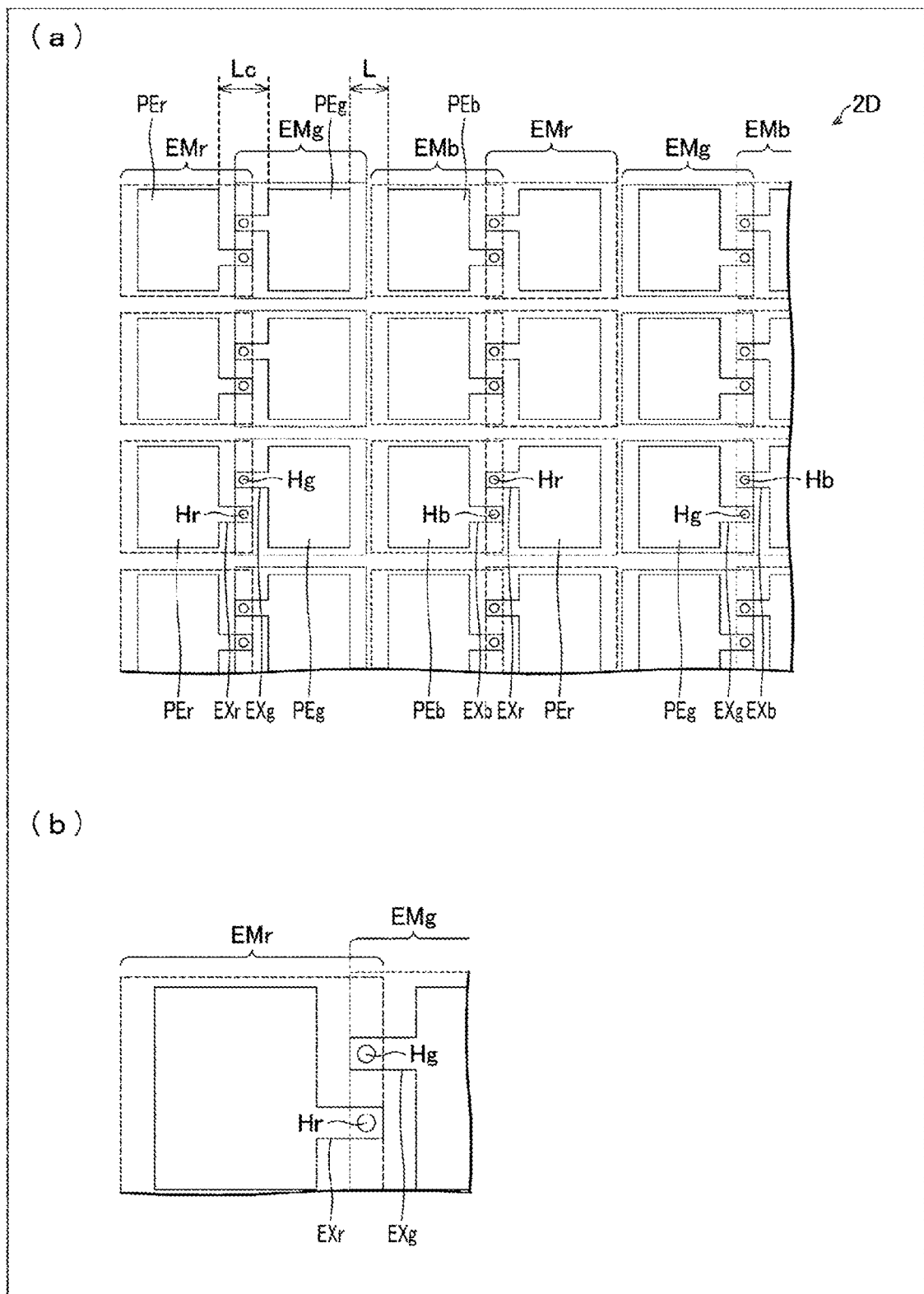
FIG. 22(a) is a plan view of a display device according to Example 4.
FIG. 22(b) is a plan view illustrating a modification example of Example 4.

In this way, the contact holes Hr and Hg of the adjacent pixel electrodes PEr and PEg face each other. The contact hole Hg and the contact hole Hb of the pixel electrode PEg and the pixel electrode PEb do not face each other. The contact hole Hb and such another contact holes Hr of the pixel electrode PEb and such another pixel electrode PEr face each other. This configuration is repeated as illustrated in FIG. 22 (a).

The light-emitting layer EMr is formed to cover the pixel electrode PEr including the branch electrode EXr and the branch electrode EXg as illustrated in FIG. 22(a). The light-emitting layer EMg is formed to cover the pixel electrode PEg including the branch electrode EXg and the branch electrode EXr as illustrated in FIG. 22(a). Therefore, in the contact holes Hr and Hg, the light-emitting layer EMr and the light-emitting layer EMg are formed to overlap.

Similarly, the light-emitting layer EMb is formed to cover the pixel electrode PEb including the branch electrode EXb and such another branch electrode EXr as illustrated in FIG. 22(a). Such another light-emitting layer EMr is formed to cover such another pixel electrode PEr including such another branch electrode EXr and the branch electrode EXb as illustrated in FIG. 22(a). Therefore, in the contact hole Hb and such another contact hole Hr, the light-emitting layer EMb and such another light-emitting layer EMr are formed overlapping.

A distance Lc between the pixel electrode PEr and the pixel electrode PEg the contact holes of which face is longer than a distance L between the pixel electrode PEb and such another pixel electrode PEg the contact holes of which do not face each other. Here, the distance Lc between the pixel electrode PEr and the pixel electrode PEg refers to a distance between the pixel electrode PEr excluding the branch electrode EXr and the pixel electrode PEg excluding the branch electrode EXg as illustrated in FIG. 22(a).

In the example illustrated in FIG. 22(a), the light-emitting layer EMr is formed for each pixel electrode PEr, but one light-emitting layer EMr that is common to a plurality of pixel electrodes PEr arranged in a row may be formed in rows. The same applies to the light-emitting layer EMg and the light-emitting layer EMb.

In the modification example illustrated in FIG. 22(b), the light-emitting layer EMg is formed in the contact hole Hr only on the inclined face and is not formed on the bottom. Therefore, two layers of the light-emitting layer EMr and the light-emitting layer EMg are formed in the inclined face 15r of the contact hole Hr, and only one layer of the light-emitting layer EMr is formed on the bottom of the contact hole Hr. In this configuration, the bottom of the contact hole Hr emits a red light.

Similarly, the light-emitting layer EMr is formed in the contact hole Hg only on the inclined face 15g and is not formed on the bottom. Therefore, two layers of the light-emitting layer EMr and the light-emitting layer EMg are formed in the contact hole Hg, and only one layer of the light-emitting layer EMg is formed on the bottom of the contact hole Hg. In this configuration, the bottom of the contact hole Hg emits a green light.

Supplement

A display device according to Aspect 1 includes: an organic insulating film formed to cover a first TFT and including a first contact hole, the first contact hole being provided with a first inclined face; a first pixel electrode formed on the first contact hole and the organic insulating film; a first intra-pixel wiring line formed under the organic insulating film and electrically connected to the first pixel electrode via the first contact hole, the first intra-pixel wiring line being electrically connect to the first TFT; a first light-emitting layer formed on the organic insulating film, the first light-emitting layer covering the first pixel electrode; a second light-emitting layer corresponding to a second pixel electrode adjacent to the first pixel electrode, the second light-emitting layer being formed to overlap the first light-emitting layer at least in the first inclined face of the first contact hole; and a common electrode formed on the first light-emitting layer to cover the first pixel electrode.

In Aspect 2, the first and second light-emitting layers include quantum dots.

In Aspect 3, a luminescent color of the first light-emitting layer differs from a luminescent color of the second light-emitting layer.

In Aspect 4, the second light-emitting layer is formed closer to the common electrode than the first light-emitting layer in the first inclined face of the first contact hole, and a wavelength of the luminescent color of the second light-emitting layer is longer than a wavelength of the luminescent color of the first light-emitting layer.

In Aspect 5, the second light-emitting layer is formed closer to the common electrode than the first light-emitting layer in the first inclined face of the first contact hole, and a wavelength of the luminescent color of the second light-emitting layer is shorter than a wavelength of the luminescent color of the first light-emitting layer.

In Aspect 6, the first light-emitting layer is formed on a bottom and the first inclined face of the first contact hole, and the second light-emitting layer is not formed in on the bottom of the first contact hole and is formed on the first inclined face of the first contact hole.

In Aspect 7, the organic insulating film is formed to cover a second TFT and includes a second contact hole, the second contact hole being provided with a second inclined face, the second pixel electrode adjacent to the first pixel electrode is formed on the second contact hole and the organic insulating film, the display device further includes a second intra-pixel wiring line formed under the organic insulating film and electrically connected to the second pixel electrode via the second contact hole, the second intra-pixel wiring line being electrically connected to the second TFT, the second light-emitting layer is formed on the organic insulating film, the second light-emitting layer covering the second pixel electrode, the display device further includes a third light-emitting layer corresponding to a third pixel electrode adjacent to the second pixel electrode, the third light-emitting layer being formed to overlap the second light-emitting layer at least in the second inclined face of the second contact hole, the first light-emitting layer is a blue light-emitting layer, the second light-emitting layer is a green light-emitting layer, the third light-emitting layer is a red light-emitting layer, the first and second pixel electrodes are one of a cathode and an anode, the common electrode is the other of the cathode and the anode, and the one of the cathode and the anode, the blue light-emitting layer, the green light-emitting layer, the red light-emitting layer, and the other of the cathode and the anode are formed in this order.

In Aspect 8, three layers of the first light-emitting layer, the second light-emitting layer, and the third light-emitting layer overlap each other in the first inclined face of the first contact hole.

In Aspect 9, the organic insulating film is formed to cover a second TFT and includes a second contact hole, the second contact hole being provided with a second inclined face, the second pixel electrode adjacent to the first pixel electrode is formed on the second contact hole and the organic insulating film, the first light-emitting layer and the second light-emitting layer emit lights, the lights being different from each other, the first pixel electrode includes a first branch electrode protruding toward the second pixel electrode, the second pixel electrode includes a second branch electrode protruding toward the first pixel electrode, the second branch electrode facing the first branch electrode, the first contact hole is formed at a position corresponding to the first branch electrode, and the second contact hole is formed at a position corresponding to the second branch electrode.

In Aspect 10, the display device further includes a third pixel electrode disposed opposite to the first pixel electrode with respect to the second pixel electrode; and a fourth pixel electrode disposed opposite to the second pixel electrode with respect to the third pixel electrode, wherein the third pixel electrode corresponds to a third light-emitting layer, the third light-emitting layer emitting a light different from lights emitted by the first light-emitting layer and the second light-emitting layer, the fourth pixel electrode corresponds to a fourth light-emitting layer, the fourth light-emitting layer emitting a light the same as the first light-emitting layer, the third pixel electrode includes a third branch electrode protruding toward the fourth pixel electrode, the fourth pixel electrode includes a fourth branch electrode protruding toward the third pixel electrode, the fourth branch electrode facing the third branch electrode, and a distance between the first pixel electrode excluding the first branch electrode and the second pixel electrode excluding the second branch electrode is longer than a distance between the second pixel electrode and the third pixel electrode.

In Aspect 11, the first light-emitting layer and the second light-emitting layer further include photosensitive resins.

In Aspect 12, shapes of the first light-emitting layer and the second light-emitting layer are different from each other when viewed from a direction perpendicular to the organic insulating film.

In Aspect 13, the display device further includes a function layer formed between the organic insulating film and the common electrode, wherein the function layer includes a charge injection layer and a charge transport layer.

In Aspect 14, the organic insulating film is formed to cover a second TFT and includes a second contact hole, the second contact hole being provided with a second inclined face, the display device further includes the second pixel electrode formed along the second inclined face of the second contact hole and the organic insulating film, and a function layer formed between the first pixel electrode and the second pixel electrode, and the function layer includes a charge injection layer and a charge transport layer.

In Aspect 15, a maximum film thickness $1b$ of the first light-emitting layer within the first contact hole is greater than a maximum film thickness $2b$ of the second light-emitting layer within the first contact hole.

In Aspect 16, an average film thickness $1t$ of the first light-emitting layer on the organic insulating film is smaller than the maximum film thickness $1b$ of the first light-emitting layer within the first contact hole, and an average film thickness $2t$ of the second light-emitting layer on the organic insulating film is smaller than the maximum film thickness $2b$ of the second light-emitting layer within the first contact hole.

In Aspect 17, an average interval e1 is smaller than a minimum interval e2, the average interval e1 being between the first pixel electrode and the common electrode on the organic insulating film, the minimum interval e2 being between the first pixel electrode and the common electrode at a location where a film thickness of the first light-emitting layer is the thinnest in the first inclined face of the first contact hole, the minimum interval e2 between the first pixel electrode and the common electrode is smaller than a sum $(1t+2t)$ of the average film thickness $1t$ of the first light-emitting layer on the organic insulating film and the average film thickness $2t$ of the second light-emitting layer on the organic insulating film, and the sum $(1t+2t)$ is smaller than a sum $(1b+2b)$ of the maximum film thickness $1b$ of the first light-emitting layer within the first contact hole and the maximum film thickness 2b of the second light-emitting layer within the first contact hole.

In Aspect 18, a height difference D of the common electrode in the first contact hole is smaller than a thickness L of the organic insulating film from a position where the first pixel electrode contacts the first intra-pixel wiring line to a top of the organic insulating film.

In Aspect 19, a first outermost edge portion c1 is included in a second outermost edge portion c2, the first outermost edge portion c1 defining a region where the first pixel electrode contacts the first intra-pixel wiring line, the second outermost edge portion c2 defining a region where a thickness of the organic insulating film changes in or near the first contact hole, the second outermost edge portion c2 is included in a third outermost edge portion c3, the third outermost edge portion c3 defining a region where the film thickness of the first light-emitting layer is thinner in or near the first contact hole, and the third outermost edge portion c3 is included in a fourth outermost edge portion c4, the fourth outermost edge portion c4 defining a region where the first light-emitting layer and the second light-emitting layer overlap on top of another.

In Aspect 20, the organic insulating film is formed to cover a second TFT and includes a second contact hole, the second contact hole being provided with a second inclined face, the display device further includes the second pixel electrode formed along the second inclined face of the second contact hole and the organic insulating film, a thickness of the first pixel electrode is smaller than a thickness from a lower surface of the first pixel electrode and second pixel electrode between the first pixel electrode and second pixel electrode to a lower surface of the common electrode, and the thickness from the lower surface of the first pixel electrode and the second pixel electrode to the lower surface of the common electrode is smaller than a distance between the first pixel electrode and the second pixel electrode.

In Aspect 21, the organic insulating film is formed to cover a second TFT and includes a second contact hole, the second contact hole being provided with a second inclined face, the second pixel electrode adjacent to the first pixel electrode is formed on the second contact hole and the organic insulating film, the display device further includes a second intra-pixel wiring line formed under the organic insulating film and electrically connected to the second pixel electrode via the second contact hole, the second intra-pixel wiring line being electrically connected to the second TFT, the second light-emitting layer is formed on the organic insulating film, the second light-emitting layer covering the second pixel electrode, the display device further includes a third light-emitting layer corresponding to a third pixel electrode adjacent to the second pixel electrode, the third light-emitting layer overlapping the second light-emitting layer at least in the second inclined face of the second contact hole, the first light-emitting layer is a blue light-emitting layer, the second light-emitting layer is a green light-emitting layer, the third light-emitting layer is a red light-emitting layer, and light emission areas of the first to third light-emitting layers are different form each other.

In Aspect 22, the light emission area of the blue light-emitting layer is larger than the light emission area of the red light-emitting layer, and the light emission area of the red light-emitting layer is larger than the light emission area of the green light-emitting layer.

In Aspect 23, the first light-emitting layer overlaps the second light-emitting layer at a peripheral edge portion of the first pixel electrode.

In Aspect 24, the second light-emitting layer is provided with an opening located on the first pixel electrode, and the opening of the second light-emitting layer is covered with the first light-emitting layer on a side closer to the first pixel electrode or the common electrode.

In Aspect 25, the display device further includes the third pixel electrode formed along the organic insulating film, wherein the first to third pixel electrodes has sizes different form each other, the second light-emitting layer is formed on the organic insulating film, the second light-emitting layer covering the second pixel electrode, the second light-emitting layer is provided with a second opening located on the third pixel electrode, and a size of the opening is different from a size of the second opening.

In Aspect 26, the organic insulating film is formed to cover a second TFT and includes a second contact hole, the second contact hole being provided with a second inclined face, the second pixel electrode adjacent to the first pixel electrode is formed on the second contact hole and the organic insulating film, the second light-emitting layer is formed on the organic insulating film, the second light-emitting layer covering the second pixel electrode, the display device further includes a third light-emitting layer corresponding to a third pixel electrode adjacent to the second pixel electrode, the third light-emitting layer overlapping the second light-emitting layer at least in the second inclined face of the second contact hole, the first light-emitting layer is a blue light-emitting layer, the second light-emitting layer is a green light-emitting layer, the third light-emitting layer is a red light-emitting layer, and in a portion where at least two of the blue light-emitting layer, the green light-emitting layer, and the red light-emitting layer overlap, the blue light-emitting layer is formed in a lower layer than the green light-emitting layer or in a lower layer than the red light-emitting layer, the red light-emitting layer is formed in an upper layer than the blue light-emitting layer or in an upper layer than the green light-emitting layer.

A method for manufacturing a display device according to Aspect 27 is a method for manufacturing a display device, the display device including an organic insulating film formed to cover a first TFT and including a first contact hole, the first contact hole being provided with a first inclined face, a first pixel electrode formed on the first contact hole and the organic insulating film, a first light-emitting layer formed on the organic insulating film, the first light-emitting layer covering the first pixel electrode, a second light-emitting layer corresponding to a second pixel electrode adjacent to the first pixel electrode, the second light-emitting layer formed to overlap the first light-emitting layer at least in the first inclined face of the first contact hole, and a common electrode formed on the first light-emitting layer, the common electrode covering the first pixel electrode, and the organic insulating film is formed to cover a second TFT and including a second contact hole, the second contact hole being provided with a second inclined face, and the display device further including the second pixel electrode formed on the second contact hole and the organic insulating film, the method comprising the steps of: forming the first light-emitting layer on the first pixel electrode and within the second contact hole using a quantum dot photoresist; and forming the second light-emitting layer on the second pixel electrode and within the first contact hole using a quantum dot photoresist.

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in the embodiments.

REFERENCE SIGNS LIST

2 Display device
4 TFT layer
8 EL layer
11r TFT (first TFT)
11g TFT (first TFT)
11b TFT (first TFT)
15r Inclined face (first inclined face)
15g Inclined face (first inclined face)
15b Inclined face (first inclined face)
SPr, SPg, SPb Subpixel
PEr Pixel electrode (first pixel electrode, third pixel electrode)
PEg Pixel electrode (first pixel electrode, second pixel electrode)
PEb Pixel electrode (first pixel electrode)
EMr Light-emitting layer (first light-emitting layer)
EMg Light-emitting layer (first light-emitting layer, second light-emitting layer)
EMb Light-emitting layer (first light-emitting layer)
EMR Light-emitting layer (second light-emitting layer, third light-emitting layer)
EMG Light-emitting layer (second light-emitting layer)
EMB Light-emitting layer (second light-emitting layer)
EDr, EDg, EDb Peripheral edge portion (of pixel electrode)
Exr, Exg, Exb Branch electrode
KE Common electrode
Hr Contact hole (first contact hole)
Hg Contact hole (first contact hole, second contact hole)
Hb Contact hole (first contact hole)
PF Organic insulating film
SHr Intra-pixel wiring line (first intra-pixel wiring line)
SHg Intra-pixel wiring line (first intra-pixel wiring line)
SHb Intra-pixel wiring line (first intra-pixel wiring line)
FLa Lower function layer
FLb Upper function layer

The invention claimed is:

1. A display device comprising:
an organic insulating film formed to cover a first thin film transistor (TFT) and including a first contact hole, the first contact hole being provided with a first inclined face;
a first pixel electrode formed on the first contact hole and the organic insulating film;
a first intra-pixel wiring line formed under the organic insulating film and electrically connected to the first pixel electrode via the first contact hole, the first intra-pixel wiring line being electrically connected to the first TFT;
a first light-emitting layer formed on the organic insulating film, and covering the first pixel electrode;
a second light-emitting layer corresponding to a second pixel electrode adjacent to the first pixel electrode, the second light-emitting layer being formed to overlap the first light-emitting layer at least in the first inclined face of the first contact hole; and
a common electrode formed on the first light-emitting layer to cover the first pixel electrode, wherein
the first light-emitting layer and the second light-emitting layer include quantum dots,
the first light-emitting layer overlaps the second light-emitting layer at a peripheral edge portion of the first pixel electrode, and
the first light-emitting layer and the second light-emitting layer cover the peripheral edge portion of the first pixel electrode.

2. The display device according to claim 1,
wherein a luminescent color of the first light-emitting layer differs from a luminescent color of the second light-emitting layer.

3. The display device according to claim 2,
wherein the second light-emitting layer is formed closer to the common electrode than the first light-emitting layer in the first inclined face of the first contact hole, and
a wavelength of the luminescent color of the second light-emitting layer is longer than a wavelength of the luminescent color of the first light-emitting layer.

4. The display device according to claim 2,
wherein the second light-emitting layer is formed closer to the common electrode than the first light-emitting layer in the first inclined face of the first contact hole, and
a wavelength of the luminescent color of the second light-emitting layer is shorter than a wavelength of the luminescent color of the first light-emitting layer.

5. The display device according to claim 1,
wherein the first light-emitting layer is formed on a bottom and the first inclined face of the first contact hole, and
the second light-emitting layer is not formed on the bottom of the first contact hole and is formed on the first inclined face of the first contact hole.

6. The display device according to claim 1,
wherein the organic insulating film is formed to cover a second TFT and includes a second contact hole, the second contact hole being provided with a second inclined face,
the second pixel electrode adjacent to the first pixel electrode is formed on the second contact hole and the organic insulating film,
the display device further includes a second intra-pixel wiring line formed under the organic insulating film and electrically connected to the second pixel electrode via the second contact hole, the second intra-pixel wiring line being electrically connected to the second TFT,
the second light-emitting layer is formed on the organic insulating film, and covers the second pixel electrode,
the display device further includes a third light-emitting layer corresponding to a third pixel electrode adjacent to the second pixel electrode, the third light-emitting layer being formed to overlap the second light-emitting layer at least in the second inclined face of the second contact hole,
the first light-emitting layer is a blue light-emitting layer,
the second light-emitting layer is a green light-emitting layer,
the third light-emitting layer is a red light-emitting layer,
the first and second pixel electrodes are one of a cathode and an anode,
the common electrode is the other of the cathode and the anode, and
the one of the cathode and the anode, the blue light-emitting layer, the green light-emitting layer, the red light-emitting layer, and the other of the cathode and the anode are formed in this order.

7. The display device according to claim 6,
wherein three layers of the first light-emitting layer, the second light-emitting layer, and the third light-emitting layer overlap each other in the first inclined face of the first contact hole.

8. The display device according to claim 1,
wherein the organic insulating film is formed to cover a second TFT and includes a second contact hole, the second contact hole being provided with a second inclined face,
the second pixel electrode adjacent to the first pixel electrode is formed on the second contact hole and the organic insulating film,
the first light-emitting layer and the second light-emitting layer emit lights, the lights being different from each other,
the first pixel electrode includes a first branch electrode protruding toward the second pixel electrode,
the second pixel electrode includes a second branch electrode protruding toward the first pixel electrode, the second branch electrode facing the first branch electrode,
the first contact hole is formed at a position corresponding to the first branch electrode, and
the second contact hole is formed at a position corresponding to the second branch electrode.

9. The display device according to claim 8, further comprising:
a third pixel electrode disposed opposite to the first pixel electrode with respect to the second pixel electrode; and
a fourth pixel electrode disposed opposite to the second pixel electrode with respect to the third pixel electrode,
wherein the third pixel electrode corresponds to a third light-emitting layer, the third light-emitting layer emitting a light different from lights emitted by the first light-emitting layer and the second light-emitting layer,
the fourth pixel electrode corresponds to a fourth light-emitting layer, the fourth light-emitting layer emitting a light the same as the first light-emitting layer,
the third pixel electrode includes a third branch electrode protruding toward the fourth pixel electrode,
the fourth pixel electrode includes a fourth branch electrode protruding toward the third pixel electrode, the fourth branch electrode facing the third branch electrode, and
a distance between the first pixel electrode excluding the first branch electrode and the second pixel electrode excluding the second branch electrode is longer than a distance between the second pixel electrode and the third pixel electrode.

10. The display device according to claim 1,
wherein the first light-emitting layer and the second light-emitting layer further include photosensitive resins.

11. The display device according to claim 1,
wherein shapes of the first light-emitting layer and the second light-emitting layer are different from each other when viewed from a direction perpendicular to the organic insulating film.

12. The display device according to claim 1, further comprising:
a function layer formed between the organic insulating film and the common electrode,
wherein the function layer includes a charge injection layer and a charge transport layer.

13. The display device according to claim 1,
wherein the organic insulating film is formed to cover a second TFT and includes a second contact hole, the second contact hole being provided with a second inclined face,
the display device further includes
the second pixel electrode formed along the second inclined face of the second contact hole and the organic insulating film, and
a function layer formed between the first pixel electrode and the second pixel electrode, and
the function layer includes a charge injection layer and a charge transport layer.

14. The display device according to claim 1,
wherein the organic insulating film is formed to cover a second TFT and includes a second contact hole, the second contact hole being provided with a second inclined face,
the second pixel electrode adjacent to the first pixel electrode is formed on the second contact hole and the organic insulating film,
the display device further includes a second intra-pixel wiring line formed under the organic insulating film and electrically connected to the second pixel electrode via the second contact hole, the second intra-pixel wiring line being electrically connected to the second TFT,
the second light-emitting layer is formed on the organic insulating film, and covers the second pixel electrode,
the display device further includes a third light-emitting layer corresponding to a third pixel electrode adjacent to the second pixel electrode, the third light-emitting layer overlapping the second light-emitting layer at least in the second inclined face of the second contact hole,
the first light-emitting layer is a blue light-emitting layer,
the second light-emitting layer is a green light-emitting layer,
the third light-emitting layer is a red light-emitting layer, and
light emission areas of the first to third light-emitting layers are different from each other.

15. The display device according to claim 14,
wherein the light emission area of the blue light-emitting layer is larger than the light emission area of the red light-emitting layer, and
the light emission area of the red light-emitting layer is larger than the light emission area of the green light-emitting layer.

16. The display device according to claim 1,
wherein the second light-emitting layer is formed continuously across the entire display region, and is provided with an opening located on the first pixel electrode, and
the opening of the second light-emitting layer is covered with the first light-emitting layer on a side closer to the first pixel electrode or the common electrode.

17. The display device according to claim 16, further comprising:
a third pixel electrode formed along the organic insulating film,
wherein the first to third pixel electrodes have sizes different from each other,
the second light-emitting layer is formed on the organic insulating film, and covers the second pixel electrode,
the second light-emitting layer is provided with a second opening located on the third pixel electrode, and a size of the opening is different from a size of the second opening.

18. The display device according to claim 1,
wherein the organic insulating film is formed to cover a second TFT and includes a second contact hole, the second contact hole being provided with a second inclined face, the second pixel electrode adjacent to the first pixel electrode is formed on the second contact hole and the organic insulating film, the second light-emitting layer is formed on the organic insulating film, and covers the second pixel electrode, the display device further includes a third light-emitting layer corresponding to a third pixel electrode adjacent to the second pixel electrode, the third light-emitting layer overlapping the second light-emitting layer at least in the second inclined face of the second contact hole, the first light-emitting layer is a blue light-emitting layer, the second light-emitting layer is a green light-emitting layer, the third light-emitting layer is a red light-emitting layer, and in a portion where at least two of the blue light-emitting layer, the green light-emitting layer, and the red light-emitting layer overlap, the blue light-emitting layer is formed in a lower layer than the green light-emitting layer or in a lower layer than the red light-emitting layer, the red light-emitting layer is formed in an upper layer than the blue light-emitting layer or in an upper layer than the green light-emitting layer.

* * * * *